(12) United States Patent
Zhong et al.

(10) Patent No.: US 11,796,620 B2
(45) Date of Patent: Oct. 24, 2023

(54) FREE-BREATHING MRI WITH MOTION COMPENSATION

(71) Applicants: Siemens Healthcare GmbH, Erlangen (DE); The Regents of the University of California, Oakland, CA (US)

(72) Inventors: Xiaodong Zhong, Oak Park, CA (US); Holden H. Wu, Los Angeles, CA (US); Vibhas S. Deshpande, Austin, TX (US); Tess Armstrong, Los Angeles, CA (US); Li Pan, Perry Hall, MD (US); Marcel Dominik Nickel, Herzogenaurach (DE); Stephan Kannengiesser, Wuppertal (DE)

(73) Assignees: Siemens Healthcare GmbH, Erlangen (DE); The Regents of the University of California, Oakland, CA (US)

( * ) Notice: Subject to any disclaimer, the term of this patent is extended or adjusted under 35 U.S.C. 154(b) by 0 days.

(21) Appl. No.: 17/491,553

(22) Filed: Oct. 1, 2021

(65) Prior Publication Data
US 2022/0128641 A1    Apr. 28, 2022

Related U.S. Application Data

(62) Division of application No. 16/782,416, filed on Feb. 5, 2020, now Pat. No. 11,175,366.
(Continued)

(51) Int. Cl.
*G01V 3/00* (2006.01)
*G01R 33/565* (2006.01)
(Continued)

(52) U.S. Cl.
CPC ... *G01R 33/56509* (2013.01); *G01R 33/4822* (2013.01); *G01R 33/4835* (2013.01); *G01R 33/5676* (2013.01); *G01R 33/56554* (2013.01)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

| 2010/0272322 A1 | 10/2010 | Koehler |
| 2012/0101367 A1 | 4/2012 | Kim |

(Continued)

FOREIGN PATENT DOCUMENTS

| CN | 105209636 A | * | 12/2015 | ........... C12Q 1/6886 |
| CN | 103533892 B | * | 8/2016 | ............. A61B 6/032 |

(Continued)

OTHER PUBLICATIONS

Yokoo, Takeshi, et al. "Nonalcoholic fatty liver disease: diagnostic and fat-grading accuracy of low-flip-angle multiecho gradient-recalled-echo MR imaging at 1.5 T." Radiology 251.1 (2009): 67-76.
(Continued)

*Primary Examiner* — Walter L Lindsay, Jr.

(57) ABSTRACT

A method for acquiring magnetic resonance imaging data with respiratory motion compensation using one or more motion signals includes acquiring a plurality of gradient-delay-corrected radial readout views of a subject using a free-breathing multi-echo pulse sequence, and sampling a plurality of data points of the gradient-delay-corrected radial readout views to yield a self-gating signal. The self-gating signal is used to determine a plurality of respiratory motion states corresponding to the plurality of gradient-delay-corrected radial readout views. The respiratory motion states are used to correct respiratory motion bias in the gradient-delay-corrected radial readout views, thereby yielding gradient-delay-corrected and motion-compensated multi-echo data. One or more images are reconstructed using the
(Continued)

gradient-delay-corrected and motion-compensated multi-echo data.

19 Claims, 22 Drawing Sheets
(12 of 22 Drawing Sheet(s) Filed in Color)

Related U.S. Application Data

(60) Provisional application No. 62/801,116, filed on Feb. 5, 2019.

(51) Int. Cl.
*G01R 33/48* (2006.01)
*G01R 33/483* (2006.01)
*G01R 33/567* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2014/0126795 | A1* | 5/2014 | Zhong | G01R 33/4828 324/309 |
| 2014/0249435 | A1 | 9/2014 | Banet et al. | |
| 2015/0192653 | A1* | 7/2015 | Sharif | A61B 5/0044 600/420 |
| 2016/0104279 | A1* | 4/2016 | Li | G06T 7/337 382/131 |
| 2016/0213261 | A1 | 7/2016 | Fleischer et al. | |
| 2016/0249850 | A1 | 9/2016 | Afifi | |
| 2016/0266223 | A1* | 9/2016 | Bi | G01R 33/5607 |
| 2016/0282430 | A1* | 9/2016 | Gulani | G01R 33/5613 |
| 2018/0100910 | A1 | 4/2018 | Hernando | |
| 2019/0142297 | A1 | 5/2019 | Du et al. | |

FOREIGN PATENT DOCUMENTS

| | | | | |
|---|---|---|---|---|
| EP | 1328195 | B1 * | 7/2017 | ............. A61B 34/20 |
| EP | 3413071 | A1 * | 12/2018 | ......... G01R 33/4826 |
| WO | WO-2012070951 | A1 * | 5/2012 | ............. A61B 5/055 |
| WO | WO-2015164761 | A1 * | 10/2015 | ........... A61B 5/0044 |
| WO | WO-2017196878 | A1 * | 11/2017 | ............. A61B 5/055 |

OTHER PUBLICATIONS

Dixon, W. Thomas. "Simple proton spectroscopic imaging." Radiology 153.1 (1984): 189-194.
Ma, Jingfei. "Dixon techniques for water and fat imaging." Journal of Magnetic Resonance Imaging: An Official Journal of the International Society for Magnetic Resonance in Medicine 28.3 (2008): 543-558.
Reeder, Scott B., et al. "Quantitative assessment of liver fat with magnetic resonance imaging and spectroscopy." Journal of magnetic resonance imaging 34.4 (2011): 729-749.
Hussain, Hero K., et al. "Hepatic fat fraction: MR imaging for quantitative measurement and display—early experience." Radiology 237.3 (2005): 1048-1055.
O'Regan, Declan P., et al. "Liver fat content and T2*: simultaneous measurement by using breath-hold multiecho MR imaging at 3.0 T—feasibility." Radiology 247.2 (2008): 550-557.
Guiu, Boris, et al. "Quantification of liver fat content: comparison of triple-echo chemical shift gradient-echo imaging and in vivo proton MR spectroscopy." Radiology 250.1 (2009): 95-102.
Yokoo, Takeshi, et al. "Estimation of hepatic proton-density fat fraction by using MR imaging at 3.0 T." Radiology 258.3 (2011): 749-759.
Koken, P., H. Eggers, and P. Börnert. "Fast single breath-hold 3D abdominal imaging with water-fat separation." Proc Intl Soc Magn Reson Med. vol. 15. 2007.
Yu, Huanzhou, et al. "Multiecho water-fat separation and simultaneous R estimation with multifrequency fat spectrum modeling." Magnetic Resonance in Medicine: An Official Journal of the International Society for Magnetic Resonance in Medicine 60.5 (2008): 1122-1134.
Zhong, Xiaodong, et al. "Liver fat quantification using a multi-step adaptive fitting approach with multi-echo GRE imaging." Magnetic resonance in medicine 72.5 (2014): 1353-1365.
Wood, John C., et al. "MRI R2 and R2* mapping accurately estimates hepatic iron concentration in transfusion-dependent thalassemia and sickle cell disease patients." Blood 106.4 (2005): 1460-1465.
Hankins, Jane S., et al. "R2* magnetic resonance imaging of the liver in patients with iron overload." Blood, The Journal of the American Society of Hematology 113.20 (2009): 4853-4855.
Hernando, Diego, et al. "Quantification of liver iron with MRI: state of the art and remaining challenges." Journal of Magnetic Resonance Imaging 40.5 (2014): 1003-1021.
Hernando, Diego, J. Harald Kramer, and Scott B. Reeder. "Multipeak fat-corrected complex R2* relaxometry: theory, optimization, and clinical validation." Magnetic resonance in medicine 70.5 (2013): 1319-1331.
Armstrong, Tess, et al. "Free-breathing liver fat quantification using a multiecho 3 D stack-of-radial technique." Magnetic resonance in medicine 79.1 (2018): 370-382.
Block, Kai Tobias, et al. "Towards routine clinical use of radial stack-of-stars 3D gradient-echo sequences for reducing motion sensitivity." Journal of the Korean Society of Magnetic Resonance in Medicine 18.2 (2014): 87-106.
Grimm, R., et al. "Self-gating reconstructions of motion and perfusion for free-breathing T1-weighted DCEMRI of the thorax using 3D stack-of-stars GRE imaging." Proceedings of the 20th scientific meeting, International Society for Magnetic Resonance in Medicine. 2012.
Grimm, Robert, et al. "Optimal channel selection for respiratory self-gating signals." Proc. 21st Annual Meeting ISMRM, Salt Lake City, Utah, USA. 2013.
Hernando, Diego, et al. "R mapping in the presence of macroscopic B0 field variations." Magnetic resonance in medicine 68.3 (2012): 830-840.
Priban, I. P. "An analysis of some short-term patterns of breathing in man at rest." The Journal of physiology 166.3 (1963): 425-434.
Horng, Debra E., et al. "Comparison of R2* correction methods for accurate fat quantification in fatty liver." Journal of Magnetic Resonance Imaging 37.2 (2013): 414-422.

\* cited by examiner

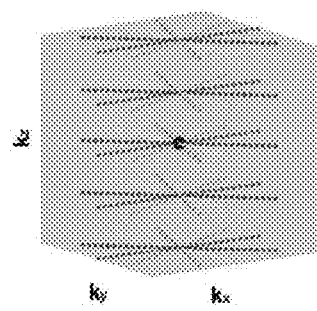 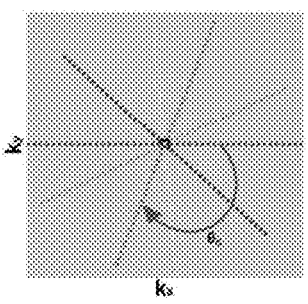 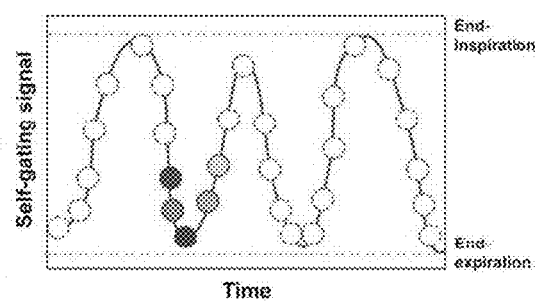
*Fig. 2A*  *Fig. 2B*  *Fig. 2C*

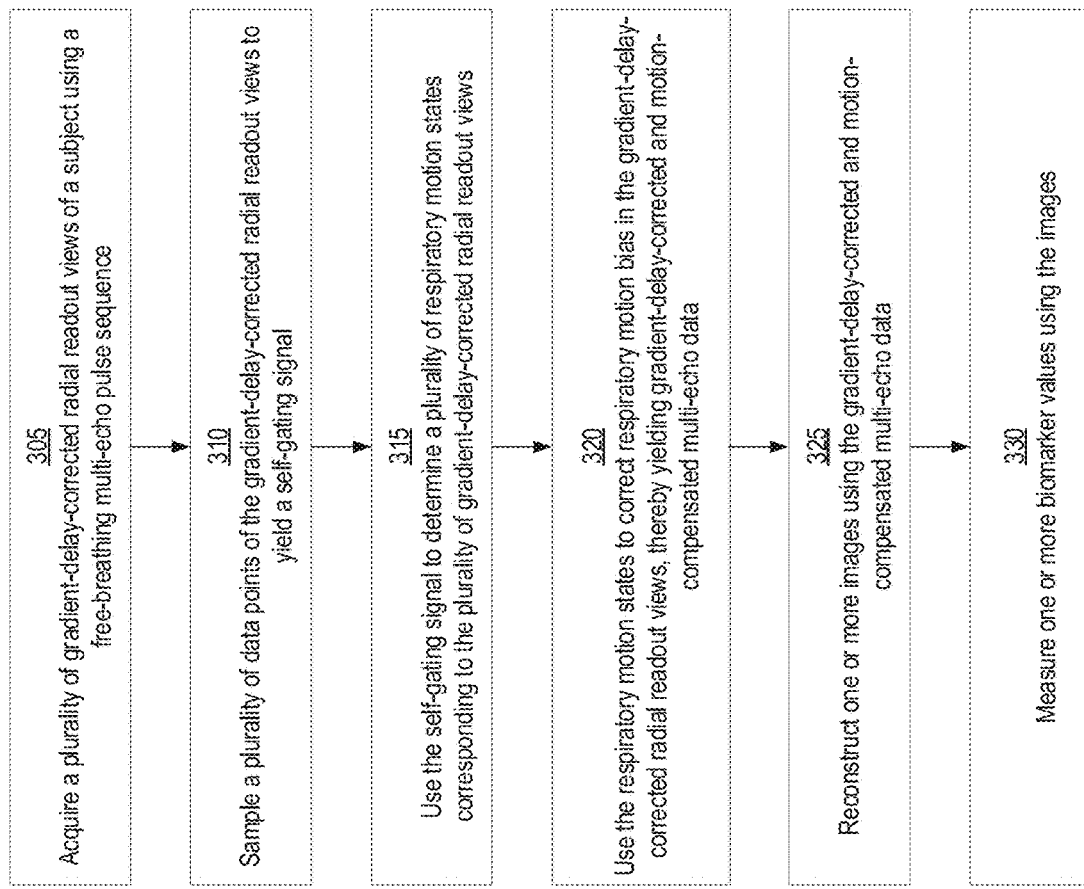

| Imaging parameters | Breath-hold Cartesian | Stack-of-radial | |
| --- | --- | --- | --- |
| | | Breath-hold (x 3) | Free-breathing (> 6) |
| TR (ms) | 8.85 | 8.85 | 8.85 |
| TE (ms) | 1.23, 2.46, 3.69, 4.92, 6.15, 7.38 | 1.23, 2.46, 3.69, 4.92, 6.15, 7.38 | 1.23, 2.46, 3.69, 4.92, 6.15, 7.38 |
| Field of view (mm$^2$) | 410 × 410 | 410 × 410 | 410 × 410 |
| Image matrix | 256 × 256 | 256 × 256 | 256 × 256 |
| Acquired k-space lines or radial views per slice | 64 | 160 | See Supporting Information Table S2 |
| Voxel size (mm$^3$) | 1.6 × 1.6 × 5 | 1.6 × 1.6 × 5 | 1.6 × 1.6 × 5 |
| Slice number | 30 | 10 | See Supporting Information Table S2 |
| Flip angle (degree) | 5 | 5 | 5 |
| Parallel imaging acceleration factor | CAIPIRINHA 2x2 | N/A | N/A |
| Acquisition time (s) | 22 | 21 | See Supporting Information Table S2 |

Table 1 Imaging parameters of the protocols used for the 5 normal subjects in this study.

The breath-hold stack-of-radial protocol was performed three times to cover the dome, mid-level and inferior sections of the liver in three sequential breath-holds. The free-breathing stack-of-radial protocol was performed eight times with different numbers of radial views and slices (see Supporting Information Table S2). N/A: Not applicable.

CAIPIRINHA: Controlled aliasing in volumetric parallel imaging

*Fig. 4*

| | Gender | Age (years) | Weight (kg) | Height (m) | BMI (kg/m²) |
|---|---|---|---|---|---|
| Subject 1 | Male | 31 | 81.7 | 1.75 | 26.7 |
| Subject 2 | Male | 38 | 80.0 | 1.78 | 25.2 |
| Subject 3 | Female | 28 | 54.4 | 1.70 | 18.8 |
| Subject 4 | Male | 37 | 61.2 | 1.78 | 19.3 |
| Subject 5 | Male | 39 | 70.3 | 1.75 | 23.0 |
| Mean ± std | N/A | 34.6 ± 4.8 | 69.5 ± 11.8 | 1.75 ± 0.03 | 22.6 ± 3.5 |

Supporting Information Table S1. Demographic information of the 5 normal subjects in this study. N/A: Not applicable. BMI: Body mass index.

Fig. 5

| Imaging parameters | Free-breathing stack-of-radial (× 8) | | | | | | | |
|---|---|---|---|---|---|---|---|---|
| Slice number | 22 | 22 | 30 | 30 | 30 | 36 | 36 | 44 | 44 |
| Acquired radial views per slice | 404 | 808 | 404 | 808 | 808 | 404 | 808 | 404 | 808 |
| Slice oversampling (%) | 18.2 | 18.2 | 20 | 20 | 11.1 | 11.1 | 27.3 | 27.3 |
| Self-gating acceptance (%) | 40 | 40 | 40 | 40 | 40 | 40 | 40 | 40 |
| Number of radial views selected by self-gating | 161 | 320 | 161 | 320 | 320 | 161 | 320 |
| Self-gating signal temporal resolution (ms) | 230 | 230 | 320 | 320 | 355 | 355 | 495 | 495 |
| Acquisition time (s) | 111 | 202 | 154 | 280 | 171 | 312 | 240 | 436 |

Supporting Information Table S2: Detailed imaging parameters of the free-breathing stack-of-radial imaging protocols, which were performed eight times with different numbers of radial views and slices for the acquisitions of 5 normal subjects.

Fig. 6A

| | Gender | Age (years) | Weight (kg) | Height (m) | BMI (kg/m²) |
|---|---|---|---|---|---|
| Patient 1 | Male | 69 | 79.8 | 1.75 | 26.0 |
| Patient 2 | Female | 56 | 65.3 | 1.60 | 25.5 |
| Patient 3 | Female | 57 | 69.9 | 1.52 | 30.1 |
| Patient 4 | Male | 70 | 93.9 | 1.70 | 32.4 |
| Patient 5 | Female | 46 | 87.3 | 1.70 | 30.1 |
| Patient 6 | Male | 54 | 95.7 | 1.80 | 29.4 |
| Mean ± std | N/A | 58.5 ± 9.5 | 82.0 ± 12.6 | 1.68 ± 0.10 | 28.9 ± 2.7 |

Supporting Information Table S3: Demographic information of the 6 patients in this study. N/A: Non applicable. BMI: Body mass index.

Fig. 6B

| Imaging parameters | Breath-hold Cartesian | Free-breathing stack-of-radial |
|---|---|---|
| TR (ms) | 8.85 | 8.85 |
| TE (ms) | 1.23, 2.46, 3.69, 4.92, 6.15, 7.38 | 1.23, 2.46, 3.69, 4.92, 6.15, 7.38 |
| Field of view (mm²) | 410 × 410 or 360 × 360 | 410 × 410 or 360 × 360 |
| Image matrix | 256 × 256 or 224 × 224 | 256 × 256 or 224 × 224 |
| Acquired k-space lines or radial views per slice | 64 | 404 or 353 |
| Self-gating acceptance (%) | N/A | 40 |
| Number of radial views selected by self-gating | N/A | 161 or 141 |
| Voxel size (mm³) | 1.6 × 1.6 × 5 | 1.6 × 1.6 × 5 |
| Slice number | 30 | 30 |
| Slice oversampling (%) | 20 | 11 or 22 |
| Flip angle (degree) | 5 | 5 |
| Parallel imaging acceleration factor | CAIPIRINHA 2×2 | N/A |
| Acquisition time (s) | 22 | 163, 188 or 242 |

Supporting information Table S4. Imaging parameters of the protocols used for the 6 patients in this study. N/A: Not applicable. CAIPIRINHA: Controlled aliasing in volumetric parallel imaging (41).

*Fig. 10A*

| | BH Cartesian | BH Radial | FB Radial without SG (44 slices, 404 views) | FB Radial with SG (44 slices, 404 views) |
|---|---|---|---|---|
| $R_2^*$ (s$^{-1}$) | | | | |
| III | 203.4 ± 29.1 | 233.0 ± 39.0 | 242.5 ± 41.8 | 209.4 ± 40.7 |
| IVb | 235.7 ± 24.8 | 242.1 ± 31.2 | 260.4 ± 19.0 | 222.2 ± 30.0 |
| V | 249.8 ± 32.7 | 259.3 ± 30.3 | 320.7 ± 23.2 | 240.5 ± 24.9 |
| VI | 255.0 ± 26.5 | 234.5 ± 49.8 | 328.0 ± 26.5 | 219.4 ± 31.4 |
| Ex | 278.7 ± 67.3 | 288.4 ± 42.9 | 404.3 ± 41.7 | 244.2 ± 42.8 |
| PDFF (%) | | | | |
| III | 2.6 ± 2.7 | 4.7 ± 4.0 | 4.6 ± 3.2 | 4.0 ± 4.5 |
| IVb | 4.1 ± 1.5 | 3.5 ± 2.0 | 3.2 ± 1.5 | 3.5 ± 2.2 |
| V | 3.8 ± 2.2 | 3.7 ± 2.6 | 5.9 ± 1.4 | 5.1 ± 2.4 |
| VI | 4.5 ± 2.2 | 2.7 ± 3.0 | 4.9 ± 2.3 | 4.7 ± 3.6 |
| Ex | 4.6 ± 3.4 | 4.7 ± 3.3 | 6.6 ± 2.8 | 5.4 ± 3.8 |

Supporting Information Table S5: The R$_2^*$ and PDFF values measured in the ROIs of one normal subject in FIG. 9. BH: break-hold; FB: free-breathing; SG: self-gating.

PDFF: proton density fat fraction.

*Fig. 10B*

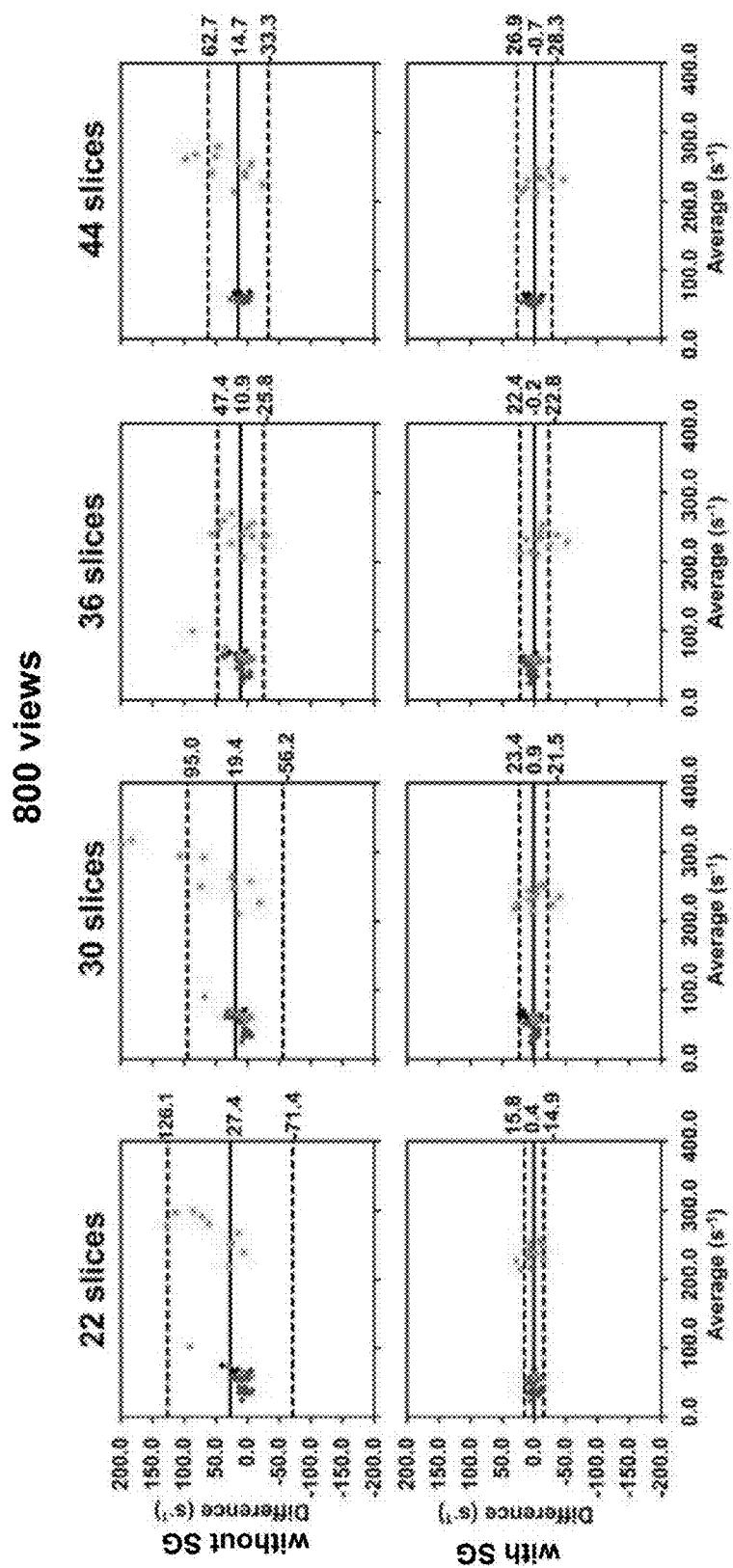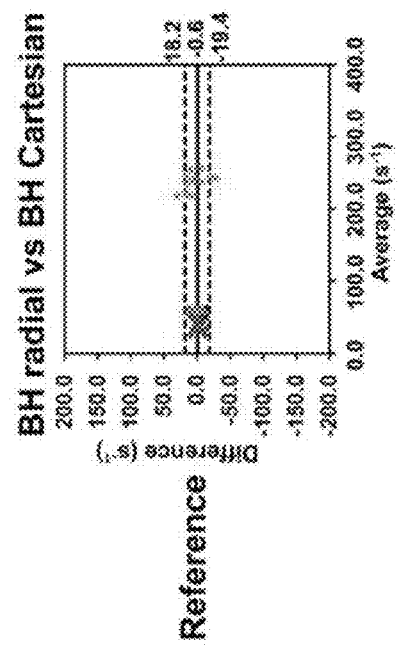
Fig. 11A

|  | $\Delta R_2^*$ | | $\Delta PDFF$ | |
|---|---|---|---|---|
|  | Estimate | p-value | Estimate | p-value |
| (Intercept) | -11.308 s⁻¹ | <0.0001* | -0.072 % | 0.465 |
| Acquisition Technique: | | | | |
| BH radial | 0.222 s⁻¹ | 1.000 | -0.467 % | 0.226 |
| FB radial with SG | -0.919 s⁻¹ | 0.939 | 0.098 % | 0.376 |
| FB radial without SG | 17.183 s⁻¹ | 0.002* | 0.125 % | 0.792 |
| ROI location: | | | | 0.669 |
| Near-Dome VII | 11.138 s⁻¹ | <0.0001* | -0.881 % | <0.0001* |
| Near-Dome VIII | 12.721 s⁻¹ | 0.129 | 0.292 % | 0.083 |
| Upper-mid-level III | -5.241 s⁻¹ | 0.098 | 0.096 % | 0.798 |
| Upper-mid-level IVa | 8.074 s⁻¹ | 0.644 | -0.086 % | 1.000 |
| Upper-mid-level VII | 16.249 s⁻¹ | 0.289 | -0.100 % | 1.000 |
| Upper-mid-level VIII | 16.624 s⁻¹ | 0.039* | 1.086 % | 1.000 |
| Lower-mid-level III | -2.363 s⁻¹ | 0.035* | -0.597 % | 0.009* |
| Lower-mid-level IVb | -2.508 s⁻¹ | 0.988 | -0.895 % | 0.372 |
| Lower-mid-level V | 6.064 s⁻¹ | 0.982 | 0.891 % | 0.082 |
| Lower-mid-level VI | 2.132 s⁻¹ | 0.533 | -0.226 % | 0.083 |
| Inferior V | -5.375 s⁻¹ | 0.984 | -0.429 % | 0.915 |
| Inferior VI | 6.467 s⁻¹ | 0.534 | -0.726 % | 0.526 |
|  |  | 0.479 |  | 0.150 |
| Number of radial views | 0.002857 s⁻¹/view | 0.486 | 0.000633 %/view | 0.037* |
| Number of slices | -0.057025 s⁻¹/slice | 0.590 | 0.001581 %/slice | 0.668 |

Supporting Information Table S6: The results of the linear mixed model fit for the 5 normal subjects. Asterisks (*) denote statistically significant differences (p-value < 0.05).

BH: breath-hold, FB: free-breathing, SG: self-gating, PDFF: proton density fat fraction.

Fig. 13

FREE-BREATHING MRI WITH MOTION COMPENSATION

CROSS REFERENCE TO RELATED APPLICATIONS

This application is a divisional of U.S. application Ser. No. 16/782,416, filed on Feb. 5, 2020, which claims benefit of Provisional Application Ser. No. 62/801,116, filed on Feb. 5, 2019, both of which are incorporated by reference.

TECHNOLOGY FIELD

The present invention relates generally to methods, systems, and apparatuses for implementing a free-breathing MRI protocol that uses one or more motion signals. The motion signals can be, for example, an inherent self-gating signal in the originally acquired MRI data. This may be applied, for example, to correct the effect of respiratory motion on three-dimensional liver $R_2^*$ relaxometry measurements to result in improved quantification accuracy.

BACKGROUND

The measurement and evaluation of tissue biomarkers are of great clinical interest, because they reflect tissue characteristics and changes influenced by diseases, potentially at early stages. Magnetic resonance imaging (MRI) is a versatile modality allowing for not only qualitative anatomical evaluation of organs and tissues but also quantitative measurement of tissue biomarkers. There is a strong need to transition from qualitative to quantitative MRI to support tissue characterization, disease staging and treatment monitoring. In addition, the development of machine learning algorithms also benefit from quantitative biomarkers as input parameters for applications such as image synthesis.

As one important application example, many diseases alter fat or iron deposition in the tissue or organ compared to normal conditions. Hepatic steatosis is a central characteristic of various liver diseases such as nonalcoholic fatty liver disease. Increased liver iron content is associated with chronic viral hepatitis, alcoholic liver disease, nonalcoholic steatohepatitis, hemochromatosis and repeated blood transfusion. Proton-density fat fraction (PDFF) and $R_2^*$ are well-established MRI biomarkers to evaluate fat overload and iron overload, respectively. $R_2^*$ has been shown to correlate closely with liver iron concentration (LIC). Ideally, a pixel-by-pixel mapping of biomarker values is preferred because of the possibility of further data analysis of any region of interest (ROI) and the capability to differentiate focal changes in the tissue. Additionally, the accuracy of quantitative biomarkers is essential if they are to be used clinically.

Three-dimensional (3D) breath-hold multi-echo gradient-echo (GRE) imaging is a well-validated and clinically used technique for liver PDFF and $R_2^*$ measurements, but conventional methods using Cartesian sampling require breath-holding to avoid respiratory motion artifacts. In patient populations with breath-hold difficulties such as serious-condition, pediatric, sedated or elderly patients, a free-breathing acquisition may be necessary. Free-breathing quantitative techniques are also beneficial to simplify the clinical workflow for MRI scanning. Due to its relative insensitivity to motion, 3D stack-of-radial imaging was recently proposed and has been shown to provide accurate liver PDFF quantification under a free-breathing acquisition after gradient delay error correction. However, the influence of respiratory motion on $R_2^*$ quantification using free-breathing stack-of-radial imaging needs to be further compensated or corrected.

SUMMARY

Embodiments of the present invention address and overcome one or more of the above shortcomings and drawbacks, by providing methods, systems, and apparatuses related to a free-breathing stack-of-radial MRI protocol that has self-gating capability. This may be applied, for example, to correct the effect of respiratory motion on three-dimensional liver $R_2^*$ relaxometry measurements to result in improved quantification accuracy.

According to some embodiments, a method for acquiring magnetic resonance imaging data with respiratory motion compensation using one or more motion signals includes acquiring a plurality of gradient-delay-corrected radial readout views of a subject using a free-breathing multi-echo pulse sequence, and sampling a plurality of data points of the gradient-delay-corrected radial readout views to yield a self-gating signal. The self-gating signal is used to determine a plurality of respiratory motion states corresponding to the plurality of gradient-delay-corrected radial readout views. The respiratory motion states are used to correct respiratory motion bias in the gradient-delay-corrected radial readout views, thereby yielding gradient-delay-corrected and motion-compensated multi-echo data. One or more images are reconstructed using the gradient-delay-corrected and motion-compensated multi-echo data.

According to other embodiments, method for acquiring magnetic resonance imaging data with respiratory motion compensation using one or more signals includes generating, using an MRI scanner, a free-breathing multi-echo pulse sequence. This sequence includes a gradient delay calibration acquisition module configured to (i) acquire calibration data from positive and negative gradient calibrations in both the x and y directions along a k-space trajectory and (ii) cross-correlate the calibration data to calculate k-space sample shifts in $k_x$ and $k_y$ directions, respectively. The sequence further includes an imaging acquisition module configured to (i) acquire radial readout views for all $k_z$ increments before rotating to a subsequent azimuthal angle and (ii) correct the k-space trajectory for the radial readout views along each azimuthal angle using the k-space sample shifts. The method further comprises generating a self-gating signal based on the radial readout views, and using the self-gating signal to correct respiratory motion bias in the radial readout views, thereby yielding gradient-delay-corrected and motion-compensated multi-echo data. One or more images are reconstructed using the gradient-delay-corrected and motion-compensated multi-echo data.

According to other embodiments, a system for acquiring magnetic resonance imaging data with respiratory motion compensation using an inherent self-gating signal comprises an imaging device and one or more computers. The imaging device is configured to acquire a plurality of gradient-delay-corrected radial readout views of a subject using a free-breathing multi-echo pulse sequence. The computers are configured to sample a plurality of data points of the gradient-delay-corrected radial readout views to yield a self-gating signal, and use the self-gating signal to determine a plurality of respiratory motion states corresponding to the plurality of gradient-delay-corrected radial readout views. The computers are further configured to use the respiratory motion states to correct respiratory motion bias in the gradient-delay-corrected radial readout views, thereby yielding gradient-delay-corrected and motion-compensated multi-echo data.

According to other embodiments, a method for acquiring magnetic resonance imaging data with respiratory motion compensation using one or more motion signals includes acquiring a plurality of gradient-delay-corrected radial readout views and acquiring one or more motion signals describing motion of a subject. The motion signals are used to determine a plurality of respiratory motion states corresponding to the gradient-delay-corrected radial readout views. The respiratory motion states are used to correct respiratory motion bias in the gradient-delay-corrected radial readout views, thereby yielding gradient-delay-corrected and motion-compensated multi-echo data. One or more images are reconstructed using the gradient-delay-corrected and motion-compensated multi-echo data. Biomarker values using the images, and those values may be displayed in a GUI.

Additional features and advantages of the invention will be made apparent from the following detailed description of illustrative embodiments that proceeds with reference to the accompanying drawings.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures:

FIG. 2A shows an example stack-of-radial k-space sampling trajectory in the 3D view where radial readout views with the same azimuthal angle are acquired for all $k_z$ locations (as shown in the same colors) before rotating;

FIG. 2B shows a 2D view of the k-space sampling trajectory as in FIG. 2A. In this example, the radial readout view (red) is rotated by the golden-angle increment $\theta_G$ to the next radial readout view angle (green);

FIG. 2C shows an illustration of a self-gating signal curve and MRI data sampling corresponding to FIGS. 2A and 2B;

FIG. 3 illustrates a method for acquiring magnetic resonance imaging data with respiratory motion compensation using an inherent self-gating signal, according to the techniques described herein;

FIG. 4 is a table of imaging parameters of the protocols used for a proof of concept study described herein;

FIG. 5 is a table showing demographic information for normal subjects in the proof of concept study described herein;

FIG. 6A provides detailed imaging parameters of free-breathing stack-of-radial imaging protocols for the proof of concept study described herein;

FIG. 6B is a table showing demographic information for patients in the proof of concept study described herein;

FIG. 10A is a table showing imaging parameters for protocols used in the proof of concept study discussed herein;

FIG. 10B is a table showing $R_2^*$ and PDFF values measured in one subject for the proof of concept study discussed herein;

FIG. 11A shows Bland-Altman plots of 3 normal subjects comparing the $R_2^*$ results from free-breathing radial acquisitions with different numbers of slices with 800 radial views vs. $R_2^*$ of the reference breath-hold Cartesian acquisition;

FIG. 13 presents results of the linear mixed model fit for the 5 normal subjects in the proof of concept study discussed herein;

DETAILED DESCRIPTION OF ILLUSTRATIVE EMBODIMENTS

The following disclosure describes the present invention according to several embodiments directed at methods, systems, and apparatuses for performing a multi-echo GRE stack-of-radial MRI acquisition with gradient delay correction and self-gating respiratory motion compensation. The following document describes the acquisition and correction techniques, as well as a proof of concept study that illustrates how the techniques may be performed in some embodiments. The results of the proof of concept study demonstrate agreement in liver $R_2^*$ quantification compared to reference results of breath-hold Cartesian MRI. While radial sampling inherently provides respiratory motion insensitivity for qualitative imaging and gradient delay correction is effective for accurate fat quantification, the in vivo results of normal subjects and clinical patients and statistical analysis in the proof of concept study show that adding motion compensation is essential for accurate $R_2^*$ mapping. By enabling accurate free-breathing $R_2^*$ mapping, the techniques described herein make free-breathing fat and iron quantification collectively complete, which may be suitable for fat and iron quantification in patient populations with breath-hold difficulties.

With the techniques described herein, a free-breathing multi-echo GRE stack-of-radial imaging sequence capable of the golden-angle angular ordering is modified to support gradient delay correction, self-gating motion compensation, and quantification of PDFF and $R_2^*$. Example free-breathing multi-echo GRE stack-of-radial imaging sequences that may be used are described in: Block K T, Chandarana H, Milla S, Bruno M, Mulholland T, Fatterpekar G, Hagiwara M, Grimm R, Geppert C, Kiefer B, Sodickson D K. Towards routine clinical use of radial stack-of-stars 3D gradient-echo sequences for reducing motion sensitivity. J Korean Soc Magn Reson Med 2014; 18:87-106; and Fujinaga Y, Kitou Y, Ohya A, Adachi Y, Tamaru N, Shiobara A, UedaH, Nickel M D, Maruyama K, Kadoya M. Advantages of radial volumetric breath-hold examination (VIBE) with k-space weighted image contrast reconstruction (KWIC) over Cartesian VIBE in liver imaging of volunteers simulating inadequate or no breath-holding ability. Eur Radiol 2016; 26:2790-2797.

Figure 1A:
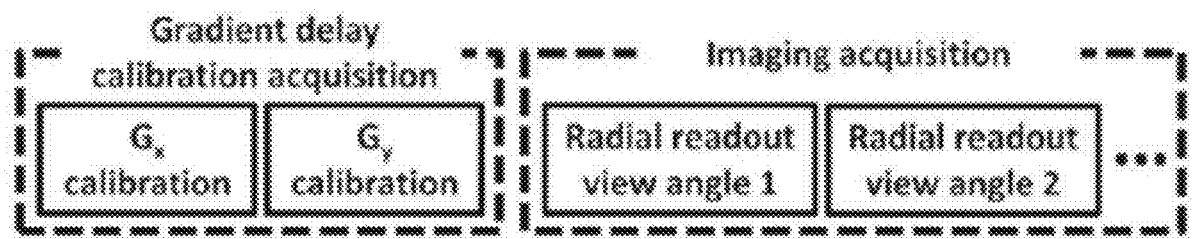
FIG. 1A shows a schematic block figure of a motion-compensated free-breathing stack-of-radial MRI pulse sequence, according to some embodiments.
Figure 1B:
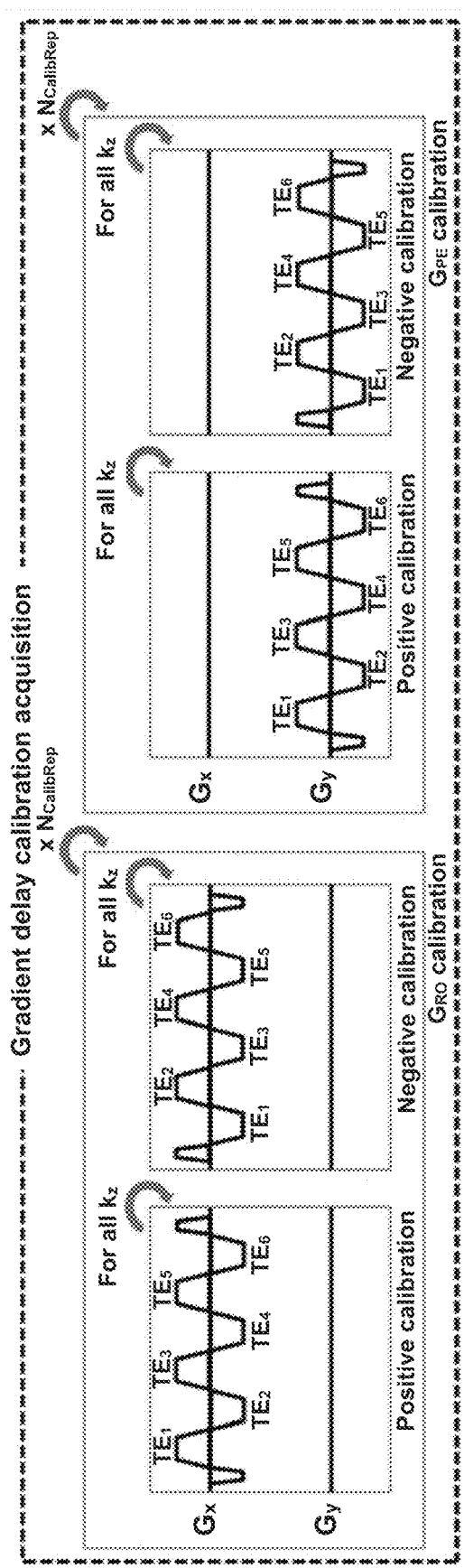
FIG. 1B shows a detailed imaging diagram of a gradient delay calibration acquisition module that may be used in some embodiments.
Figure 1C:
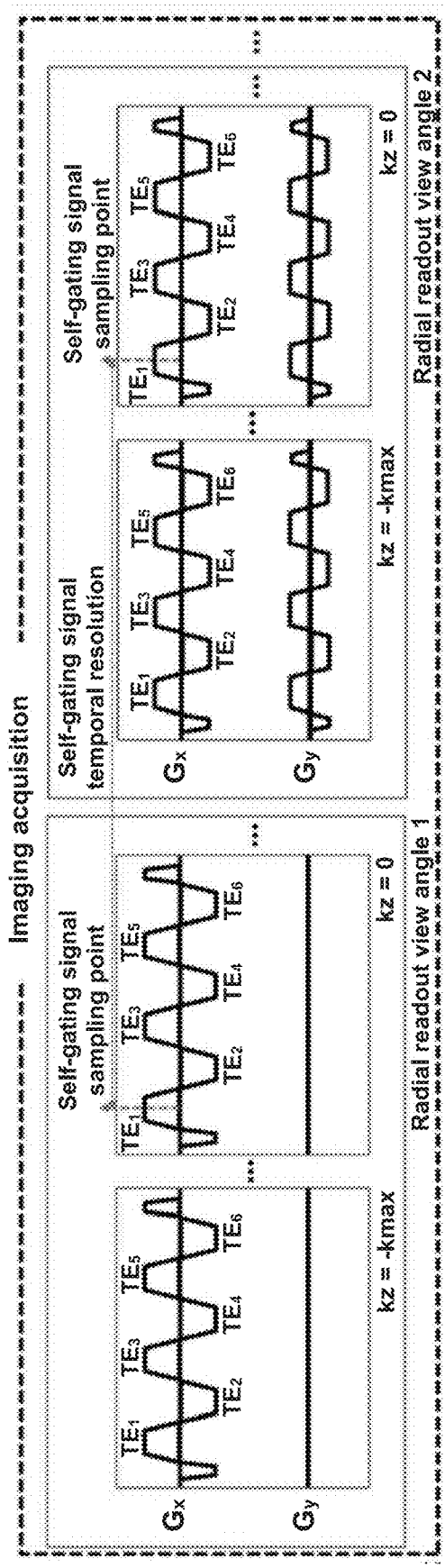
FIG. 1C shows a detailed imaging diagram of an imaging acquisition module that may be used in some embodiments.

FIGS. 1A-1C illustrate example pulse sequence for data acquisition that may be used with the techniques described herein. Without loss of generality, the slice-select direction is assumed to align with the z axis of the gradient system, and the in-plane axes are the x and y axes. This pulse sequence contains two modules, including the gradient delay calibration acquisition module and the imaging acquisition module as shown in FIG. 1A.

As is generally understood in the art, gradient delays and related effects can cause differences between the specified k-space trajectory and the k-space trajectory that is actually acquired. This could, in turn, degrade the image that is reconstructed from the acquired data. To avoid such degradation, the MRI scanner is calibrated to eliminate or compensate the differences during acquisition or reconstruction. In the gradient delay calibration acquisition module shown in FIG. 1B, data from positive and negative gradient calibrations are acquired in both the x and y directions, and cross-correlated to calculate the k-space sample shifts in the $k_x$ and $k_y$ directions, respectively. The measured k-space sample shifts are used to correct the k-space trajectory for readouts along each azimuthal angle. In some embodiments, gradient delay calibration is performed for each echo and each channel. The imaging acquisition module is shown in FIG. 1C. Radial readout views are acquired for all $k_z$ increments before rotating to the next azimuthal angle.

Example k-space sampling trajectories and self-gating signals are shown in FIGS. 2A and 2B. More specifically, FIG. 2A shows an example stack-of-radial k-space sampling trajectory in the 3D view. Radial readout views with the same azimuthal angle are acquired for all $k_z$ locations (as shown in the same colors) before rotating. In this example, 5 radial readout azimuthal angles are illustrated in the color of red, green, blue, cyan and yellow, respectively, in the sequential acquisition order. The black dot at the k-space origin denotes that the corresponding self-gating points are sampled when radial readout views cross it. FIG. 2B shows a 2D view of the k-space sampling trajectory as in FIG. 2A. In this example, the radial readout view (red) is rotated by the golden-angle increment $\theta_G$ to the next radial readout view angle (green).

FIG. 2C shows an illustration of a self-gating signal curve and sampling corresponding to FIGS. 2A and 2B. The solid curve is the continuous self-gating signal curve to sample. The solid dots in color are the self-gating signal points corresponding to the acquired k-space data as shown in FIGS. 2A and 2B, and the empty dots indicate additional data sampled by radial readout views not shown in FIGS. 2A and 2B. For better visualization, only part of the k-space sampling trajectory and the self-gating signal points are shown in FIGS. 2A-2C.

The data points of the radial readout views of the first echo at the k-space origin are sampled as the corresponding self-gating signal (FIGS. 1C, 2A and 2C). Therefore, the temporal resolution of the self-gating signal is determined by the repetition time (TR) and the number of phase encoding steps in the slice direction, i.e. $t_{SG}=TR \times N_{slc} \times (1+P_{slc\_os})$, where $N_{slc}$ is the imaging slice number and $P_{slc\_os}$ is the slice oversampling percentage. The self-gating signal curve is correlated to the underlying respiratory motion curve (as shown in FIG. 2C). The values of the self-gating signal data points are used to retrospectively determine the respiratory motion states that the acquired radial readout views belong to. An acceptance rate is used to specify the percentage of the acquired radial readout views which are most adjacent to a desired motion state, such as end-expiration, and a fixed overall acceptance window was determined and applied to the full duration of each self-gating signal curve to select those views for image reconstruction. Lastly, the gradient-delay-corrected and motion-compensated multi-echo data are further processed to calculate the PDFF and $R_2^*$ values.

In some embodiments, the sequence is implemented to run inline and generate Digital Imaging and Communications in Medicine (DICOM) files using the sequence and image reconstruction framework of an MRI scanner (see FIG. 16), which may also be capable of retrospective offline reconstruction using the raw data files. To improve visualization and reconstruction performance, an image background mask may be obtained from the sequence adjustment data to exclude most of the background air region from the calculation of PDFF and $R_2^*$. The self-gating signal data may also be exported (e.g., as text files) for further analysis.

FIG. 3 illustrates a method for acquiring magnetic resonance imaging data with respiratory motion compensation using an inherent self-gating signal, according to the techniques described herein. Starting at step 305, an MRI scanner is used to acquire a plurality of gradient-delay-corrected radial readout views of a subject using a free-breathing multi-echo pulse sequence. The free-breathing multi-echo pulse sequence may be implemented by modifying a variety of pulse sequences generally known in the art including, without limitation, a GRE stack-of-radial sequence, a stack-of-radial turbo spin echo sequence, a stack-of-spiral sequence, a 3D radial sequence, or a 3D cones sequence. The ordering used for acquisition can vary as well; for example, in one embodiment, a golden-angle ordering scheme is used for acquiring the gradient-delay-corrected radial readout views.

Continuing with reference to FIG. 3, at step 310, the gradient-delay-corrected radial readout views is sampled at a plurality of data points to yield a self-gating signal. As noted above, the temporal resolution of the self-gating signal may be determined by TR and the number of phase encoding steps in the slice direction. The self-gating signal is used at step 315 to determine a plurality of respiratory motion states corresponding to the plurality of gradient-delay-corrected radial readout views. The respiratory motion states are used at step 320 to correct respiratory motion bias in the gradient-delay-corrected radial readout views.

Next, at step 325, one or more images are reconstructed using the gradient-delay-corrected and motion-compensated multi-echo data generated at step 320. At step 330 one or more biomarker values are measured using the images. Once generated, these biomarker values may be presented in a graphical user interface (GUI). In some embodiments, the biomarker values comprise a PDFF value and an effective transverse relaxation rate ($R_2^*$) value. In other embodiments, the self-gating motion compensation technique illustrated in FIG. 3 can be used for free-breathing quantification of other biomarkers, such as $T_1$ relaxation time and $T_2$ relaxation time calculated from MRI data, and tissue stiffness calculated from magnetic resonance elastography data.

Proof of Concept

As a proof of concept and demonstration of the techniques described herein, a study was performed compliant with the Health Insurance Portability and Accountability Act (HIPAA) and approved by the local Institutional Review Board (IRB). Five normal subjects with no known prior liver conditions (34.6±4.8 years, one female) with BMI of 22.6±3.5 kg/m$^2$ were recruited (See FIG. 5). After written informed consent was obtained, each subject was scanned at 3T (MAGNETOM Prisma or Skyra, Siemens Healthcare, Erlangen, Germany). Imaging was performed using an anterior 18-channel flexible array coil in combination with 12-16 elements of the table-mounted spine array coil.

First, a single breath-hold multi-echo GRE sequence with 3D Cartesian k-space sampling was performed to cover the whole liver volume and calculate PDFF and $R_2^*$ maps inline as a reference standard. Second, for comparison purposes, a breath-hold stack-of-radial acquisition was performed to cover the near-dome, mid-level and inferior sections of the liver in three sequential breath-holds. Lastly, the proposed stack-of-radial sequence was performed with free-breathing acquisition, covering the whole liver. The parameters of all three imaging acquisition types, termed "breath-hold Cartesian", "breath-hold radial" and "free-breathing radial" throughout this paper, are listed in FIG. 4.

Because TR was chosen to be 8.85 ms for all acquisitions, the temporal resolution of the self-gating signal was simply determined by the number of phase encoding steps in the slice direction. To assess the performance and robustness of self-gating, multiple acquisitions with different numbers of radial views and slices were performed, with the imaging parameters listed in FIG. 6A. Gradient delay correction was performed for all radial acquisitions. Datasets of gradient delay calibration information, 3D stack-of-radial k-space data, as well as the corresponding multi-channel self-gating signals were saved for offline processing.

The exported datasets were retrospectively reconstructed offline using the image reconstruction framework to generate DICOM files of PDFF and $R_2^*$ maps. For the free-breathing radial acquisitions, the multi-channel self-gating signal datasets were read and fitted using the built-in plot function of MATLAB 2018 (MathWorks, Natick, Mass., USA) for quality assurance purposes. The channel used for the eventual respiratory self-gating signal extraction was determined by the optimal channel selection algorithm described in: Grimm R, Bauer S, Kiefer B, Hornegger J, Block T. Optimal channel selection for respiratory self-gating signals. Proc. Intl. Soc. Mag. Reson. Med. 21, 2013. p 3749, or manually adjusted in case of the occasional poor self-gating signal quality of the automatic channel selection. The free-breathing stack-of-radial acquisitions were then reconstructed without self-gating and with a 40% self-gating acceptance rate for the end-expiration state, respectively.

ROI placement and analysis were performed using ImageJ 1.51h (National Institutes of Health, Bethesda, Md., USA). In detail, four representative slices were identified separately in the $R_2^*$ maps of the breath-hold Cartesian, the breath-hold radial and the free-breathing radial acquisitions, including one slice near the liver dome, one upper-mid-level slice, one lower-mid-level slice and one slice in the inferior portion of the liver. ROIs were manually placed by a researcher in the liver segments on the four slices in the $R_2^*$ maps of the breath-hold Cartesian acquisition while avoiding large vessels: liver segments VII and VIII in the near-dome slice, II, IVa, VII and VIII in the upper-mid-level slice, III, IVb, V and VI in the lower-mid-level slice, and V and VI in the inferior slice. When necessary, the images of the first and second echoes were used for anatomic reference. This led to a total of 12 ROIs to analyze for each dataset. The ROIs were then transferred to the matching slices of the $R_2^*$ maps of the breath-hold radial and the free-breathing radial acquisitions, with slight adjustment due to the difference of breath-hold and free-breathing positions. The PDFF and $R_2^*$ values within the ROIs were measured and reported as mean±standard deviation (SD).

The breath-hold and free-breathing stack-of-radial methods were compared to the reference breath-hold Cartesian method using Bland-Altman analysis to determine the mean difference (MD) and 95% limits of agreement (LoA=MD±1.96×SD).

The difference of PDFF and $R_2^*$ between each radial measurement and the Cartesian measurement was calculated as ΔPDFF and Δ$R_2^*$ respectively, and fitted to a linear mixed model with the acquisition technique, ROI location, number of radial views and number of slices (directly related to the temporal resolution of the self-gating signal) as independent variables. Clustering effects due to multiple measurements within a subject were accounted for by treating the subjects as a random variable. After fitting the linear mixed model, any significant factors were tested post-hoc using the estimated marginal means to determine which levels were significantly different from zero. Analysis was performed using the "nlme" and "emmeans" packages in R (R Core Team, Vienna, Austria), and p-value <0.05 was regarded as significantly different.

In order to evaluate the feasibility of the techniques described herein in clinical patients, data from patients referred to clinical abdominal MRI scans at our local institution from January 2018 to January 2019 were retrospectively analyzed. The inclusion criteria of the patient data were: both breath-hold Cartesian acquisition and free-breathing stack-of-radial acquisition were performed and the data were exported so that offline retrospective reconstruction with self-gating was possible; $R_2$ was quantified using a breath-hold single-voxel spectroscopy sequence with multiple echo times and was greater than 40.4 s$^{-1}$, where the threshold value of $R_2$ was adapted from the averaged results of healthy control subjects and empirical conversion equations in previous studies; the self-gating temporal resolution of the free-breathing stack-of-radial acquisition was less than 400 ms, in order to ensure good self-gating performance; no severe motion artifacts were present on the breath-hold Cartesian images, such that breath-hold Cartesian PDFF and $R_2^*$ maps could be used as a valid reference. This patient study was compliant with HIPAA and approved by our local IRB.

Data from 6 patients (58.5±9.5 years, three females) with BMI of 28.9±2.7 kg/m² were identified and included (FIG. 6B). All subjects were scanned at 3T (MAGNETOM Prisma, Siemens Healthcare, Erlangen, Germany) with the combination of an anterior array coil and a table-mounted spine array coil. Imaging parameters of free-breathing stack-of-radial and breath-hold Cartesian acquisitions were listed in FIG. 10A. Free-breathing stack-of-radial $R_2^*$ and PDFF maps were reconstructed without and with self-gating, and compared to those of the reference breath-hold Cartesian acquisition. The ROI placement and analysis were performed similarly as in the normal subject study. Bland-Altman analysis was performed for comparison.

Among 40 free-breathing stack-of-radial acquisitions, 2 acquisitions with 44 slices and 800 radial views experienced scan abortion due to a memory allocation issue in the reconstruction. This issue was solved later in an updated implementation, but these two datasets were corrupted and could not be reconstructed. All other acquisitions were successfully completed. For one subject, the free-breathing radial acquisition with 22 slices did not cover the lower-mid-level and inferior slices due to sub-optimal imaging slice prescription. Therefore, these missing datasets were not included in the following data and statistical analysis.

Figure 7:
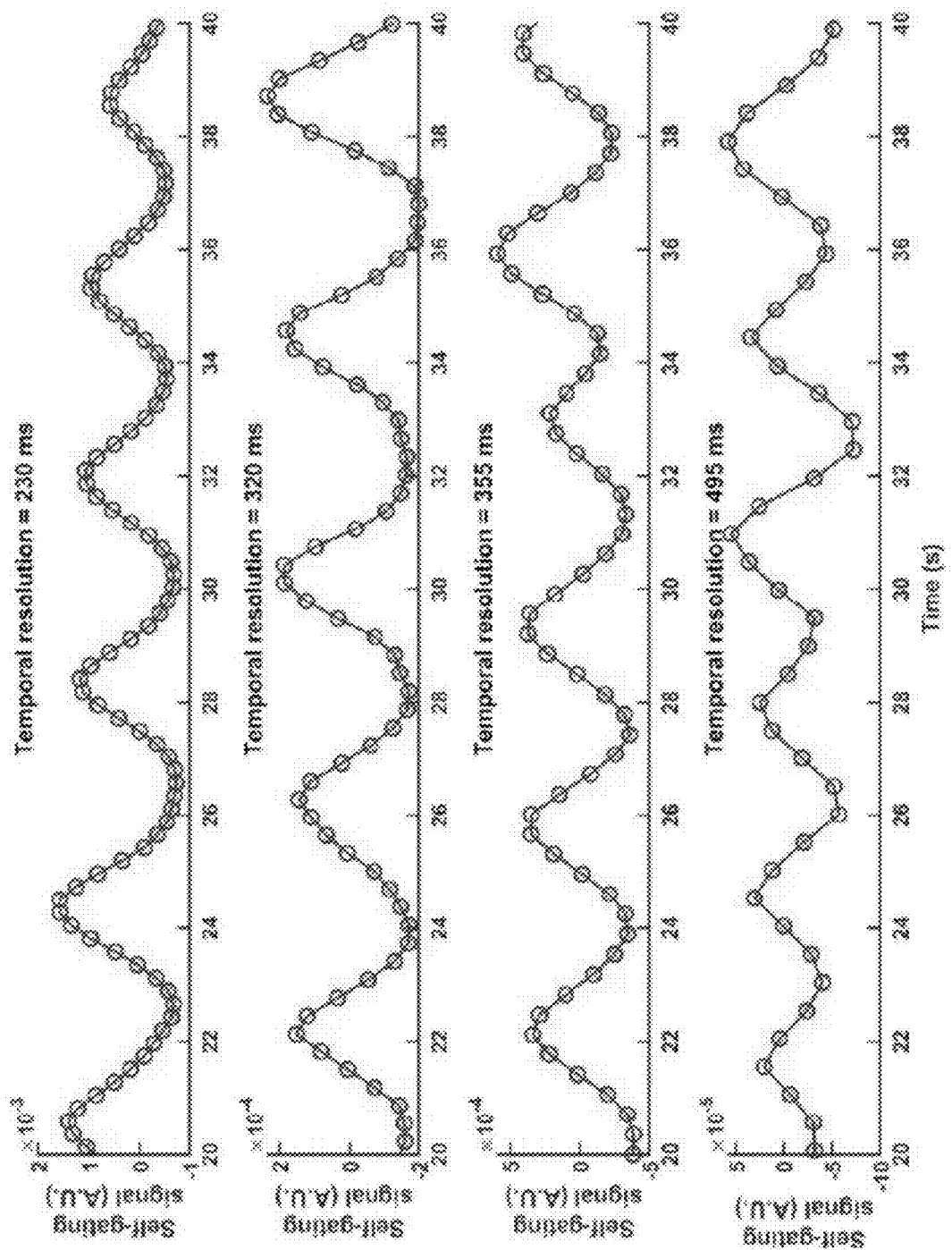
FIG. 7 shows example self-gating signal curves from one subject obtained by free-breathing radial acquisitions with 404 radial views and different temporal resolutions.

Example self-gating signal curves from one subject obtained by free-breathing radial acquisitions with 404 radial views and different temporal resolutions are shown in FIG. 7. Only the segments between 20 and 40 seconds after the start time of acquisitions are shown. The blue circles denote the sampling points of the self-gating signal, and the blue lines are the fitted self-gating signal curves. The red crosses indicate the selected radial data for image reconstruction, where a total of 40% of the data close to the end-expiration state were accepted in this example. Different signal amplitudes for different temporal resolutions were due to the different signal levels of channels selected by the optimal channel selection algorithm. The fitted self-gating signal curves clearly characterize the underlying respiratory motion, with smaller temporal resolutions exhibiting smoother curves.

Figure 8:
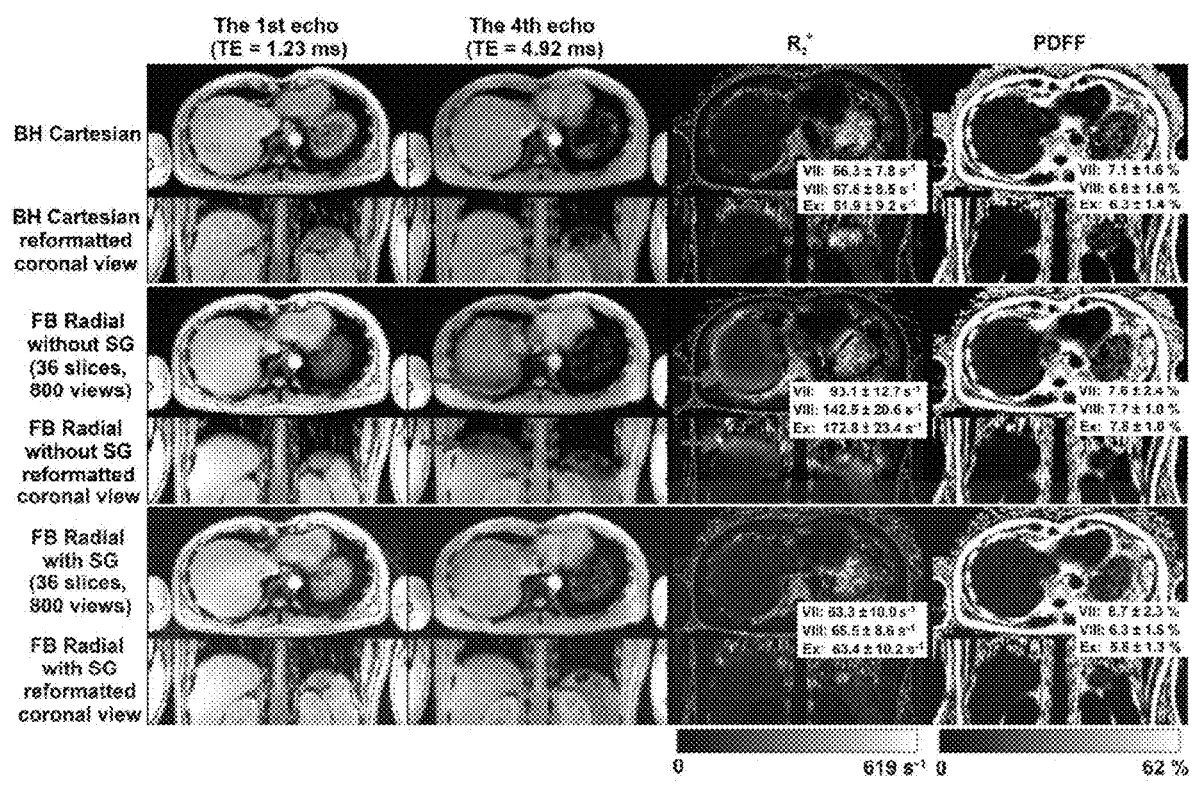
FIG. 8 shows example images and quantitative parameter maps in one subject.

Example images of the near-dome slice of one subject are shown in FIG. 8. The ROIs placed in liver segments VII and VIII on this near-dome slice are shown in green circles. An extra (Ex) ROI was placed at the signal attenuation location (yellow circle) on the reformatted coronal view.

In FIG. 8, images of the 1st and 4th echoes, $R_2^*$ maps and PDFF maps of the free-breathing radial acquisitions with 36 slices and 800 radial views are compared to those of the breath-hold Cartesian acquisitions. Reformatted coronal views are shown to visualize effects in the superior-inferior direction. While the pixel intensities on the 1st echo images of the free-breathing radial acquisition without self-gating appear to have only small variations along the superior-inferior direction, the pixel intensities on the late echo images (the 4th echo in FIG. 8) exhibited strong signal attenuation or void, especially near the edge of the liver dome (the blue arrows). In addition, this creates artifactually elevated and non-uniform $R_2^*$ values, as visualized as a bright ring around the liver boundary in the transverse view or a bright cap in the coronal view (red arrows in FIG. 8). The $R_2^*$ values measured in the ROIs for segments VII and VIII, and an extra (Ex) ROI on the $R_2^*$ map of the free-breathing radial acquisition without self-gating showed a positive bias compared to reference values measured on the reference breath-hold Cartesian $R_2^*$ map. With self-gating, these $R_2^*$ values were consistent with the breath-hold Cartesian reference values. In contrast, no obvious artifacts or spatially heterogeneous values are observed in the free-breathing radial PDFF maps both without and with self-gating.

Figure 9:
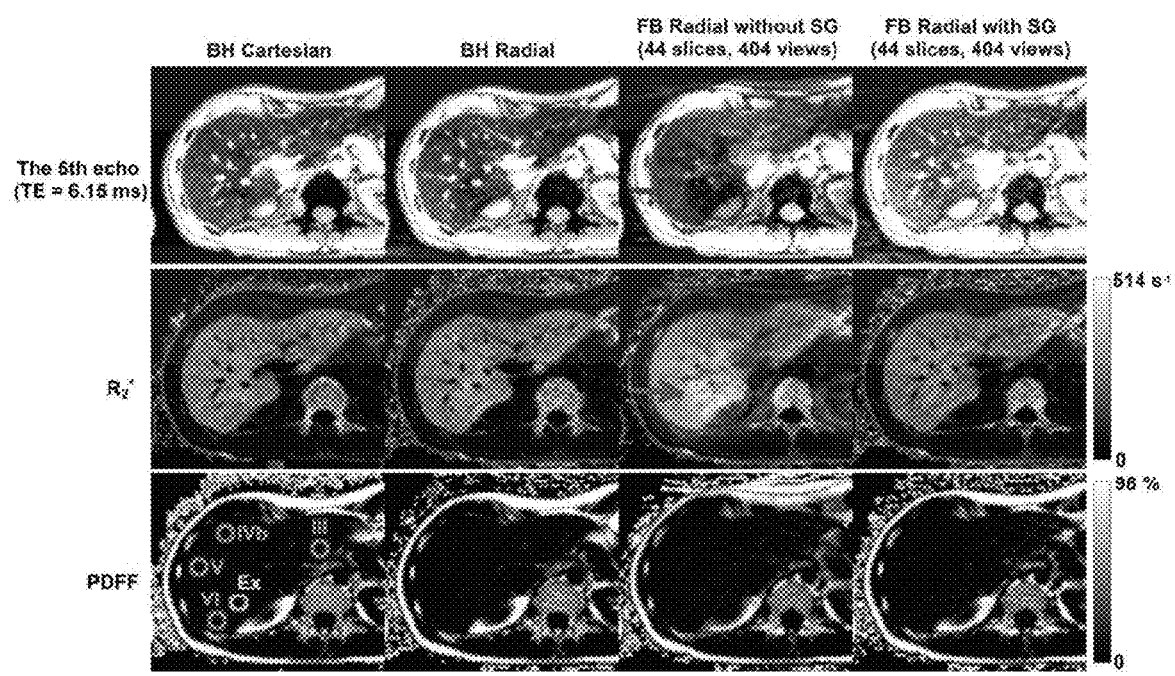
FIG. 9 shows example images of the lower-mid-level slice of a different subject, with elevated reference standard $R_2^*$ in the liver.

Example images of the lower-mid-level slice of a different subject, with elevated reference standard $R_2^*$ in the liver, are shown in FIG. 9. The ROIs placed in liver segments III, IVb, V and VI on this slice are shown in green circles. An extra (Ex) ROI was placed at the signal attenuation location (yellow circle). In FIG. 9, results of the free-breathing radial acquisitions with 44 slices and 404 radial views are compared to those of the breath-hold Cartesian and breath-hold radial acquisitions. Similar to the previous case, free-breathing radial without self-gating exhibits signal attenuation or void in the 5th echo image (blue arrow in FIG. 9), leading to an artifactually enhanced focal region in the $R_2^*$ map (red arrow in FIG. 9). Especially for ROIs in segments V, VI and Ex, free-breathing radial without self-gating showed artifactually elevated $R_2^*$ values compared to the reference results of breath-hold Cartesian and breath-hold radial (FIG. 9 and FIG. 10B). With self-gating, these values were corrected (FIG. 9 and FIG. 10B). Similarly, no obvious artifacts or spatially heterogeneous values were observed in the PDFF maps of free-breathing radial both without and with self-gating (FIG. 9 and FIG. 10B). In addition, the 5th echo image (other echoes not shown) and $R_2^*$ map of the free-breathing radial without self-gating are blurry, while the sharpness of the images and maps of the free-breathing radial with self-gating are comparable to those of reference breath-hold Cartesian and breath-hold radial acquisitions (FIG. 9).

Figure 11B:
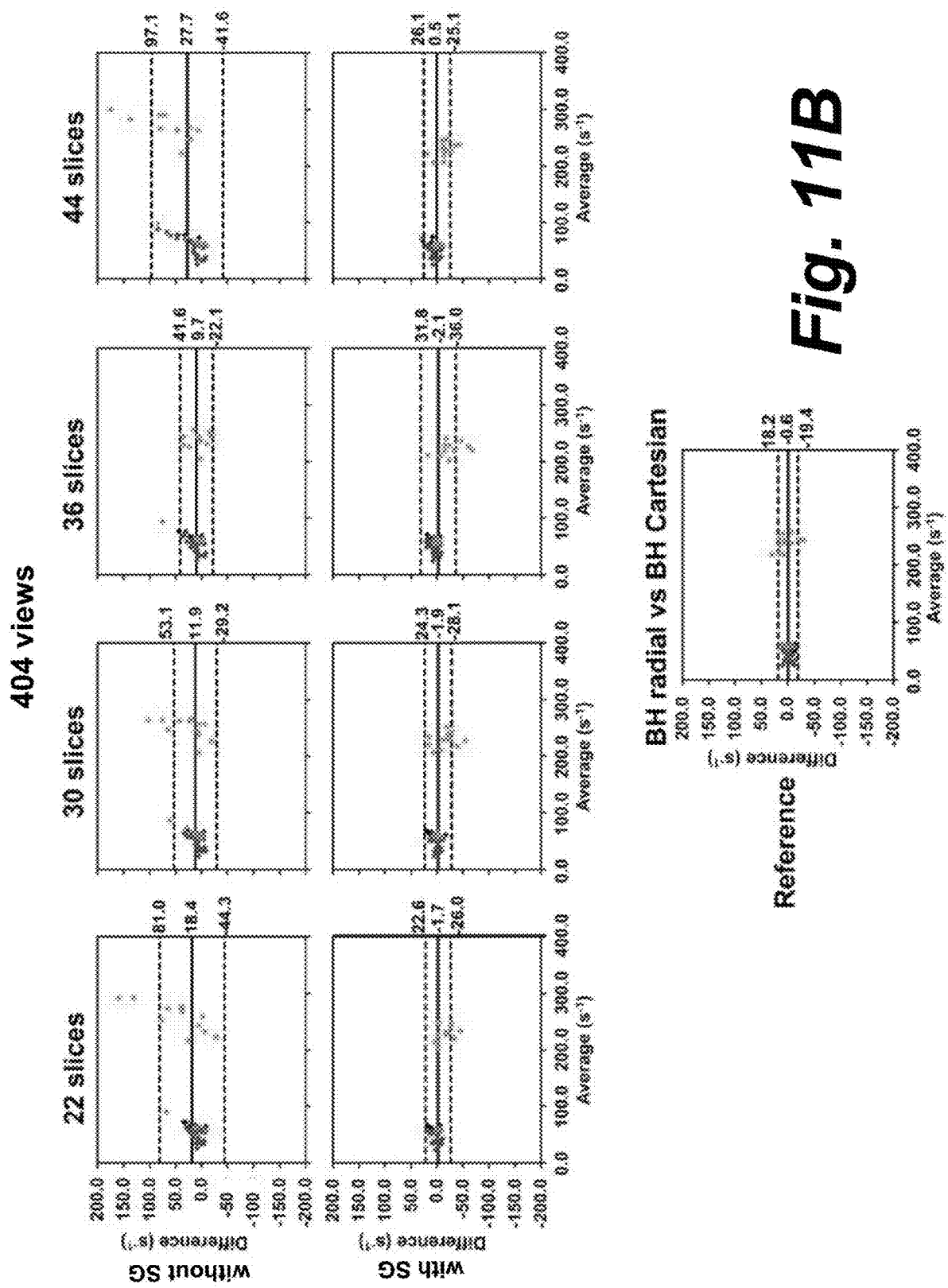
FIG. 11B shows Bland-Altman plots of 3 normal subjects comparing the $R_2^*$ results from free-breathing radial acquisitions with different numbers of slices with 404 radial views vs. $R_2^*$ of the reference breath-hold Cartesian acquisition.

Bland-Altman plots comparing $R_2^*$ maps of the breath-hold Cartesian reference to free-breathing radial are shown in FIG. 11A and FIG. 11B. In each sub-plot, the mean difference (MD) and 95% limits of agreement (LoA) are listed on the right. The data points from different subjects are shown in different colors. The Bland-Altman plot of the result of the breath-hold radial acquisition vs. the result of the breath-hold Cartesian acquisition is at the bottom as a reference.

The Bland-Altman plot comparing breath-hold Cartesian to breath-hold radial is shown at the bottom of FIG. 11A and FIG. 11B. The MD and LoA of free-breathing radial with self-gating are substantially improved compared to those without self-gating. Specifically, compared to breath-hold Cartesian, free-breathing radial without self-gating shows high MD values of 27.4 $s^{-1}$, 19.4 $s^{-1}$, 10.9 $s^{-1}$ and 14.7 $s^{-1}$ for 22, 30, 36 and 44 slices respectively with 800 radial views (the 1st row in FIG. 11A) and 18.4 $s^{-1}$, 11.9 $s^{-1}$, 9.7 $s^{-1}$ and 27.7 $s^{-1}$ for 22, 30, 36 and 44 slices respectively with 404 radial views (the 1st row in FIG. 11B), as well as relatively large LoA ranges. In contrast, free-breathing radial with self-gating shows MD of 0.4 $s^{-1}$, 0.9 $s^{-1}$, −0.2 $s^{-1}$ and −0.7 $s^{-1}$ for 22, 30, 36 and 44 slices respectively with 800 radial views (the 2nd row in FIG. 11A), and −1.7 $s^{-1}$, −1.9 $s^{-1}$, −2.1 $s^{-1}$ and 0.5 $s^{-1}$ for 22, 30, 36 and 44 slices respectively with 404 radial views (the 2nd row in FIG. 11B), and the LoA ranges are generally narrower. As a reference, breath-hold radial has an MD value of −0.6 $s^{-1}$ (the 3rd row in FIG. 11A and the 3rd row of FIG. 11B).

Figure 12A:
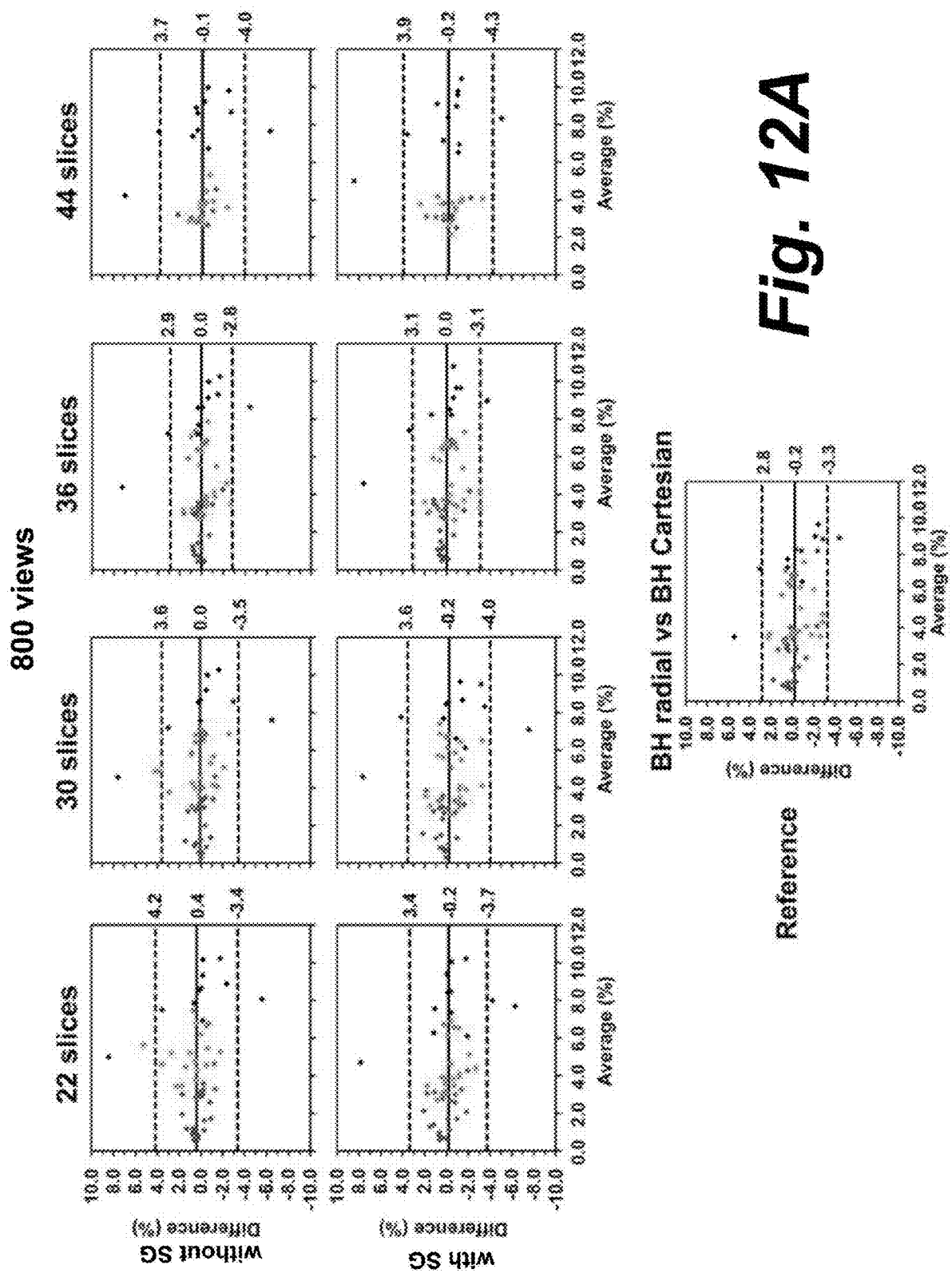
FIG. 12A shows Bland-Altman plots of 3 normal subjects comparing the PDFF measured by free-breathing radial acquisitions with different numbers of slices with 800 radial views vs. PDFF of the reference breath-hold Cartesian acquisition.
Figure 12B:
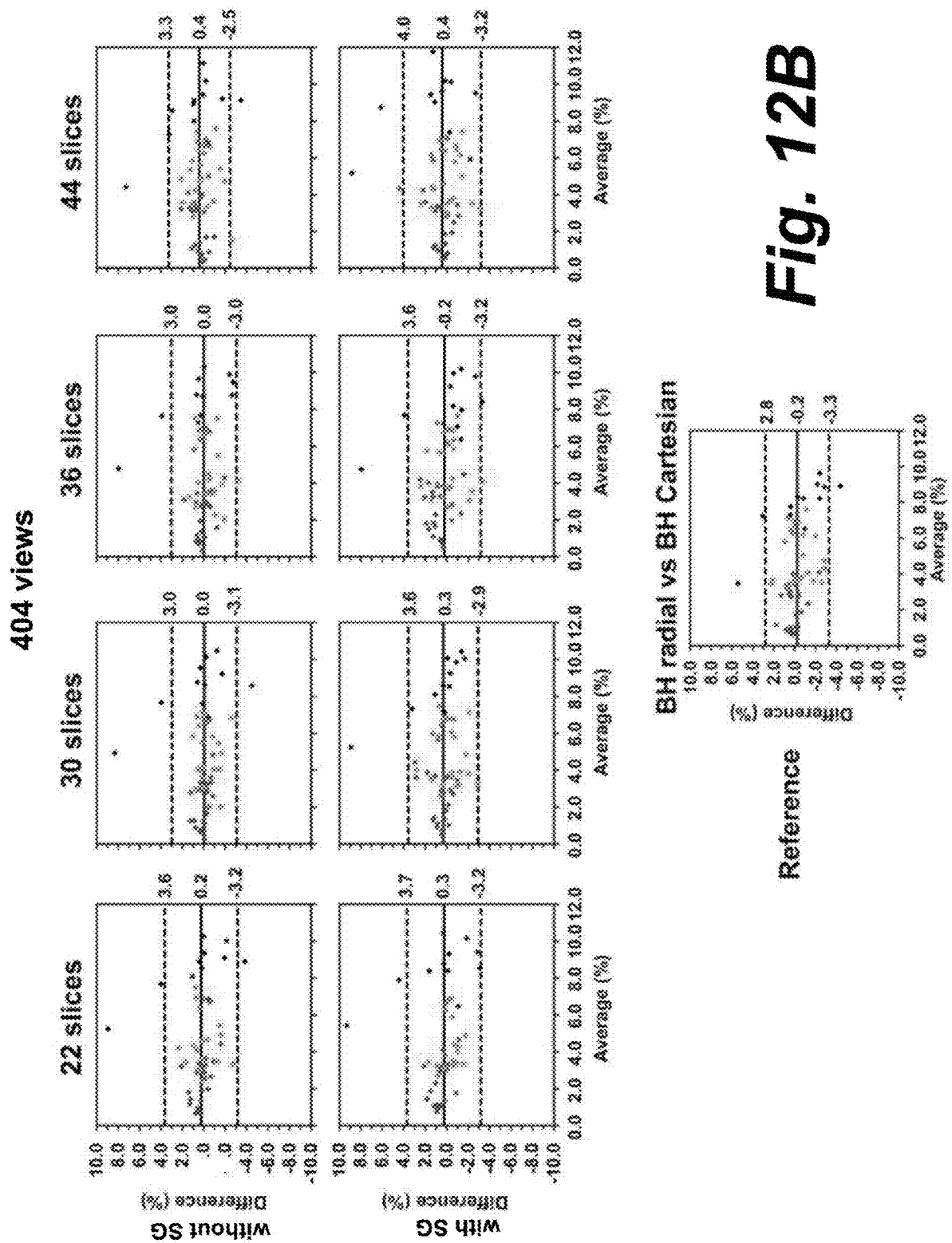
FIG. 12B shows Bland-Altman plots of 3 normal subjects comparing the PDFF measured by free-breathing radial acquisitions with different numbers of slices with 404 radial views vs. PDFF of the reference breath-hold Cartesian acquisition.

Bland-Altman plots of the corresponding PDFF comparisons are shown in FIG. 12A and FIG. 12B. As with the FIG. 11A and FIG. 11B, in each sub-plot, the MD and LoA are listed on the right, and the data points from different subjects are shown in different colors. Similar to breath-hold radial compared to breath-hold Cartesian, no obvious biases of MD values were observed for free-breathing radial without self-gating and with self-gating acquired with different numbers of slices and radial views. All LoA ranges were similar.

The results of the linear mixed model fit are listed in FIG. 13. There were no significant differences in the $\Delta R_2^*$ based on either the number of slices or the number of radial views (p>0.485), but both the ROI and the acquisition technique had a significant effect (p<0.0001). ROIs in segments VII and VIII in the upper-mid-level slice had significant effects (p<0.040) on $\Delta R_2^*$ with averaged values of 16.2 s$^{-1}$ and 16.8 s$^{-1}$ respectively. No other ROIs had any significant effects. Neither breath-hold radial nor free-breathing radial with self-gating had a $\Delta R_2^*$ significantly different from 0 (p>0.929), but free-breathing radial without self-gating had an averaged $\Delta R_2^*$ of 17.2 s$^{-1}$ which was significant (p=0.002).

As for $\Delta$PDFF, no significant differences (p>0.234) were found based on either the acquisition technique or the number of slices. The number of radial views had a significant effect (p=0.017) with a low magnitude of −0.000633%/view, meaning that increasing 160 to 800 radial views decreased $\Delta$PDFF by only 0.4%. The ROI had a significant effect (p<0.0001), where the post-hoc test showed that ROI VII in the upper-mid-level slice had a $\Delta$PDFF on average of 1.686%, which was significantly (p=0.009) larger than 0, and no other ROIs had any significant effects.

Figure 14:
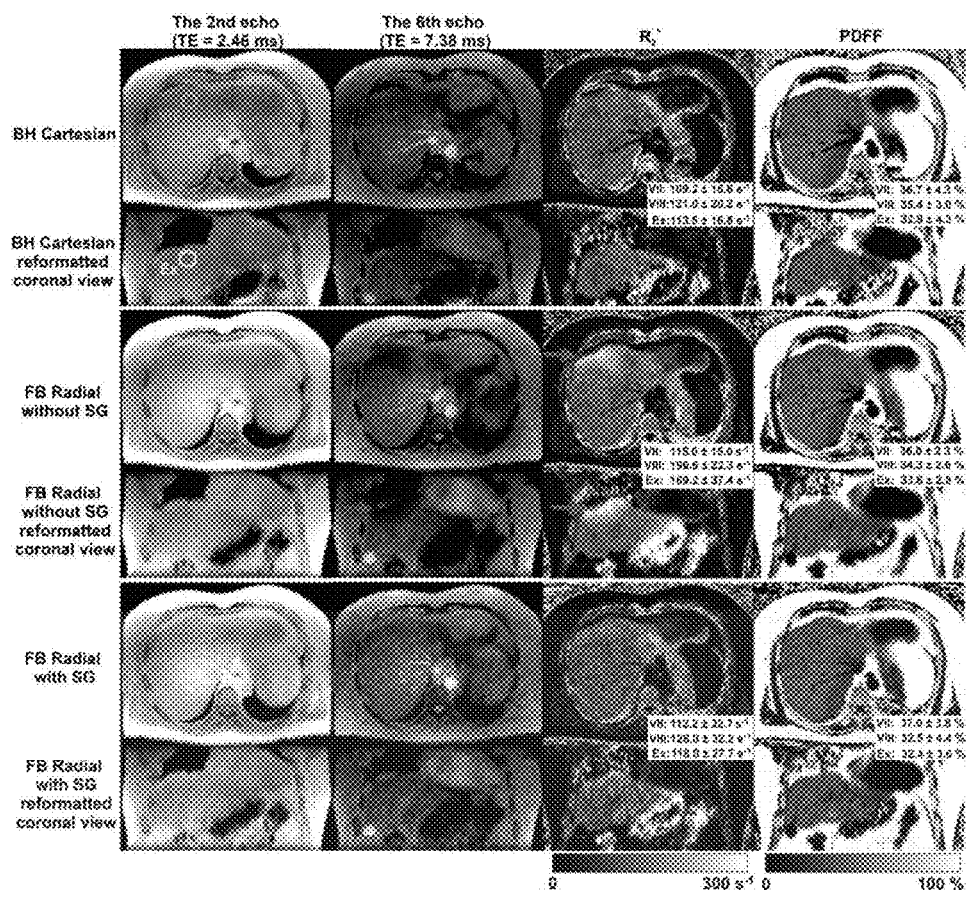
FIG. 14 shows example images and quantitative parameter maps in one patient with a body mass index (BMI) of 29.4 kg/m$^2$.

Example images of one patient with a BMI of 29.4 kg/m$^2$ are shown in FIG. 14. The ROIs placed in liver segments VII and VIII on this near-dome slice are shown in green circles. An extra (Ex) ROI was placed at the signal attenuation location (yellow circle) on the reformatted coronal view. Pixel intensities on the 6th echo images exhibited signal attenuation or void near the edge of the liver dome (blue arrows), leading to an apparent elevation of $R_2^*$ (red arrows). The $R_2^*$ values measured in the ROI for segment VIII and the Ex ROI on the $R_2^*$ map of free-breathing radial without self-gating showed positive biases compared to reference values measured on the breath-hold Cartesian $R_2^*$ map. With self-gating, these $R_2^*$ values were consistent with the reference values. Consistently, no obvious artifacts or spatially heterogeneous values were observed in the free-breathing radial PDFF maps both without and with self-gating.

Figure 15:
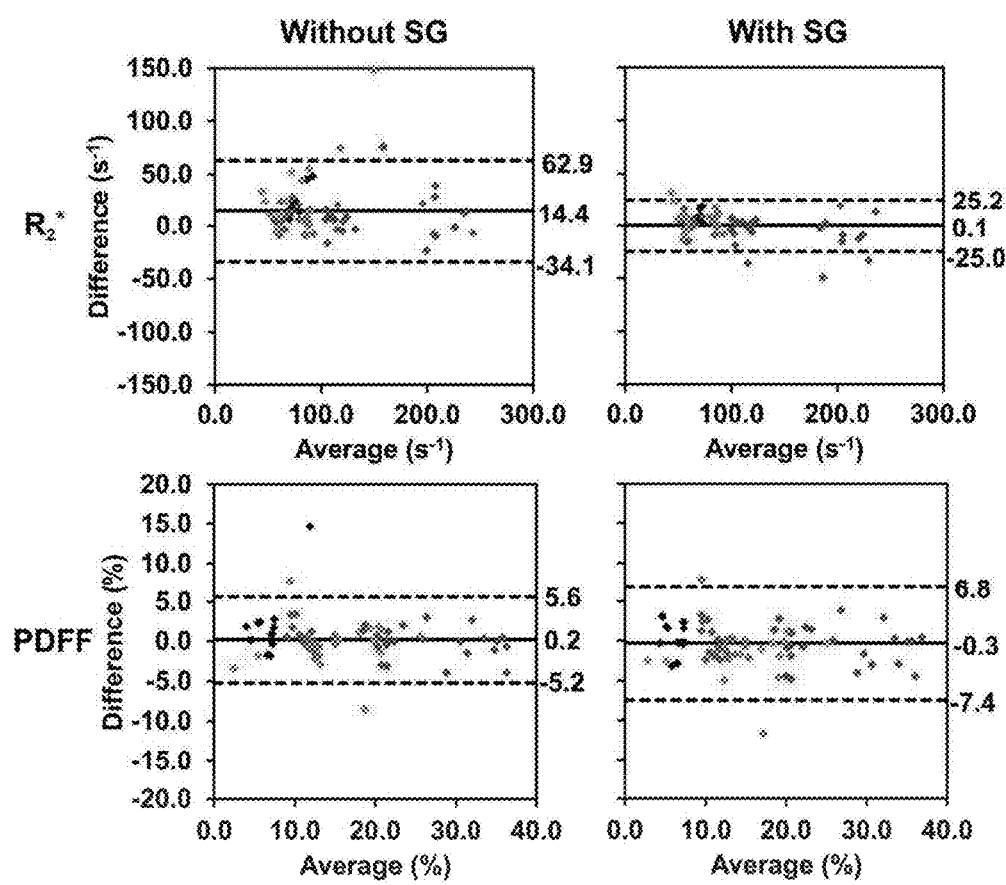
FIG. 15 shows Bland-Altman plots of 6 patients comparing the $R_2^*$ and PDFF results from free-breathing radial acquisitions vs. those of the reference breath-hold Cartesian acquisition.

Bland-Altman plots of $R_2^*$ and PDFF comparisons for the 6 patients are shown in FIG. 15. In each sub-plot, the MD) and LoA are listed on the right. For $R_2^*$, compared to breath-hold Cartesian, free-breathing radial without self-gating shows a high MD of 14.4 s$^{-1}$ and relatively large LoA ranges, while free-breathing radial with self-gating shows a substantially improved MD of 0.1 s$^{-1}$, and the LoA range is also narrower. For PDFF, no obvious biases of MD values were observed for free-breathing radial without self-gating and with self-gating, and the LoA ranges were similar for both methods.

In the proof-of-concept study, the influence of respiratory motion on liver $R_2^*$ quantification using free-breathing stack-of-radial MRI was investigated. Previous studies showed that, with gradient delay correction, free-breathing stack-of-radial imaging accurately quantified liver fat content. The results in this study revealed that stack-of-radial $R_2^*$ quantification suffered from positive bias introduced by respiratory motion if not corrected. A self-gating approach was proposed for respiratory motion compensation and accurate liver $R_2^*$ quantification. The in vivo results and statistical analyses of both normal subjects and clinical patients demonstrated the accuracy of the proposed method compared to reference results of breath-hold Cartesian MRI.

Respiratory motion, if not compensated, causes signal attenuation or void on the late echo images. This leads to apparent elevation of $R_2^*$ values, especially in regions close to or around the liver dome, creating an artifactually non-uniform $R_2^*$ map. Examples of uncorrected $R_2^*$ maps showed a bright ring around the liver boundary in the transverse view or a bright cap in the coronal view (FIG. 8 and FIG. 14), and an artifactually enhanced focal region (FIG. 9). These could be mistakenly interpreted as focal iron deposition if not informed. In addition, if used as input values for LIC estimation or machine learning algorithms, the erroneously elevated $R_2^*$ values may introduce errors.

Figure 16:
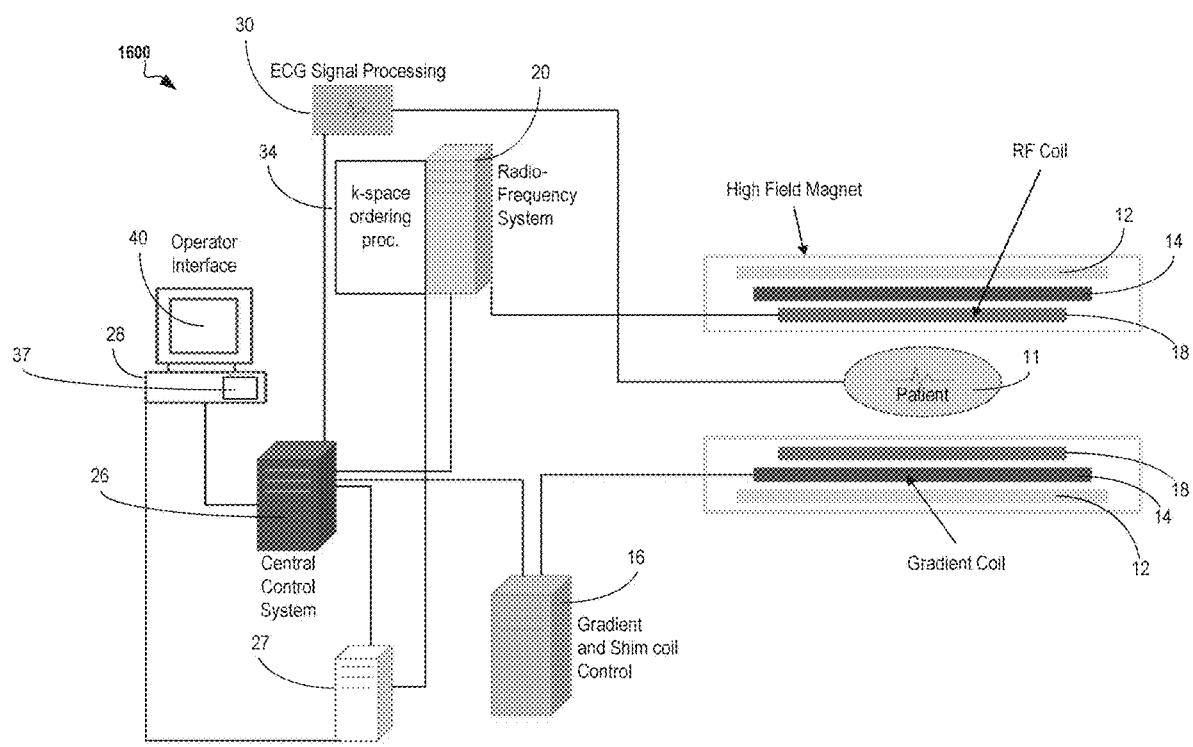
FIG. 16 shows a system for ordering acquisition of frequency domain components representing magnetic resonance (MR) image data for storage in a k-space storage array, as used by some embodiments of the present invention.

It was observed in 5 normal subjects and 6 clinical patients that the measured PDFF values (FIG. 12A, FIG. 12B, and FIG. 16) are generally more robust and have less variation than the measured $R_2^*$ values (FIG. 11A, FIG. 11B, and FIG. 16). Respiratory motion compensation was essential for accurate free-breathing $R_2^*$ quantification (FIG. 11A, FIG. 11B, and FIG. 16), but did not make a substantial difference for PDFF quantification (FIG. 12A, FIG. 12B, and FIG. 16), compared to the results without self-gating motion compensation. Therefore, if PDFF is the primary biomarker of interest and acquisition time is critical, one can still use free-breathing stack-of-radial imaging with gradient delay correction and without self-gating to save acquisition time, but should keep in mind that the accompanying measured $R_2^*$ may have a positive bias. In practice, it is highly recommended to use free-breathing stack-of-radial imaging with both gradient delay correction and self-gating to ensure accurate quantification of both PDFF and $R_2^*$.

The linear mixed model fit analysis of the normal subjects showed that self-gating had a significant impact on $R_2^*$ results measured with free-breathing radial acquisitions. Without self-gating respiratory motion compensation, the $R_2^*$ results were significantly biased by 17.2 s$^{-1}$ averagely. The bias was essentially removed with self-gating. This is consistent with other results in this study, and indicates that $R_2^*$ quantification using free-breathing radial acquisitions benefits from self-gating and motion compensation. In contrast, self-gating had no significant effects on the PDFF results. There is improvement in PDFF accuracy from increasing the number of radial views, but the magnitude of the improvement is so small that there is likely no practical benefit. ROI VII in the upper-mid-level slice had significant effects on both PDFF and $R_2^*$, as well as ROI VIII in the upper-mid-level slice on PDFF, which are possibly due to the unevenly distributed susceptibility and motion pattern in the liver.

There are many potential sources why respiratory motion influences quantification of $R_2^*$, but not PDFF. For example, a linear macroscopic Bo field variation exists in the superior-inferior direction in 3D GRE data. The process of liver voxels traveling through locations with a linear Bo field variation during respiration is analogous to the through-plane dephasing effect caused by a gradient applied in the slice direction, which could be approximated as a sinc modulation of the magnetization. In addition, at a tissue/air boundary such as the liver dome, a portion of the imaging slice may move out of the original imaging plane and be replaced with background air across different radial views at different motion states, where the inter-radial-view average of multiple motion states could have signal attenuation or void due to the partial volume effect. Both of these influences mainly affect the signal magnitude for $R_2^*$ quantification. Detailed modeling and validation of these potential sources are beyond the scope of this proof of concept study and need to be further explored.

In the multi-echo 3D stack-of-radial acquisition described herein, the temporal resolution of the self-gating signal was determined by the TR and the number of phase encoding steps in the slice direction. Several different temporal resolutions of the self-gating signal worked successfully in this study, which covered usual settings used for clinical acquisitions. Although the fitted self-gating signal curve with the temporal resolution of 495 ms appears to be less smooth and continuous than the self-gating signal curves of finer temporal resolutions, it did not cause obvious differences in $R_2^*$ mapping results. It is expected that the performance of self-gating could decrease as the temporal resolution of the self-gating signal increases. However, due to the complex nature of respiratory motion pattern and breath-to-breath and person-to-person variability, determining an optimal temporal resolution of the self-gating signal sampling needs to be investigated in future work. The method described herein worked well for a clinically relevant range of number of slices and number of radial views, i.e., 22, 30, 36 and 44 slices and 404 and 800 radial views. In the protocols of 404 radial views, only 161 radial views were selected by self-gating (40% acceptance rate near end expiration) and used for reconstruction, which could cause streaking artifacts due to undersampling. However, using the protocols in this study, it was observed that the streaking artifacts did not substantially influence the PDFF and $R_2^*$ quantification results. Based on our current experience, the protocol of 36 slices and 800 views is recommended to achieve a good balance of sufficient liver coverage, fine self-gating temporal resolution, decent image quality without noticeable streaking, good signal-to-noise ratio and reasonable acquisition time.

A self-gating acceptance rate of 40% near end expiration was used for image reconstruction in this study, which yielded 161 selected radial views for the free-breathing radial datasets acquired with 404 radial views. The breath-hold radial datasets were acquired with 160 radial views for a matched comparison. This was primarily based on empirical experience, and was not necessarily the best value. An automatic channel-selection algorithm was used to pick the best coil channel to extract the self-gating signal. While it worked for the majority of datasets, manual intervention was necessary for some datasets to select a better channel. The target respiratory motion state, optimal value of acceptance rate, and improved channel-selection algorithm of the self-gating signal are worth investigating in the future.

FIG. 16 shows a system 1600 for ordering acquisition of frequency domain components representing MR image data for storage in a k-space storage array, as used by some embodiments of the present invention. In system 1600, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 1600 to acquire radial k-space data using free-breathing stack-of-radial MRI pulse sequence described above with reference to FIGS. 1A-1C.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 16, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display of the operator interface 40. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on operator interface 40, for example.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

The term "computer readable medium" as used herein refers to any medium that participates in providing instructions to the processor for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk or removable media drive. One non-limiting example of volatile media is dynamic memory. Non-limiting examples of transmission media include coaxial cables, copper wire, and fiber optics, including the wires that make up one or more buses. Transmission media may also take the form of acoustic or light waves, such as those generated during radio wave and infrared data communications.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

We claim:

1. A method for acquiring magnetic resonance imaging (MRI) data with respiratory motion compensation using one or more motion signals, the method comprising:

acquiring, using an MM scanner, a plurality of gradient-delay-corrected radial readout views of a subject using a free-breathing multi-echo pulse sequence, each of the plurality of gradient-delay-corrected radial readout views associated with a respective one of a plurality of azimuthal angles;

sampling, using an image data processor, a data point of each of the plurality of gradient-delay-corrected radial readout views to yield a plurality of data points, the plurality of data points defining a self-gating signal;

using the self-gating signal and the image data processor to determine a respiratory motion state corresponding to each of the plurality of gradient-delay-corrected radial readout views;

using the determined respiratory motion states and the image data processor to correct respiratory motion bias in the gradient-delay-corrected radial readout views and to yield gradient-delay-corrected and motion-compensated multi-echo data;

reconstructing, using the image data processor, one or more images using the gradient-delay-corrected and motion-compensated multi-echo data; and outputting, using a display processor, the one or more images for display on an operator interface.

2. A system for acquiring magnetic resonance imaging data with respiratory motion compensation using a self-gating signal, the system comprising:

an imaging device configured to acquire a plurality of gradient-delay-corrected radial readout views of a subject using a free-breathing multi-echo pulse sequence, each of the plurality of gradient-delay-corrected radial readout views associated with a respective one of a plurality of azimuthal angles;

one or more computers communicably coupled to the imaging device and comprising memory comprising instructions stored thereon and one or more processors coupled to the memory and configured to execute the stored instructions to:

sample a data point of each of the gradient-delay-corrected radial readout views, the data points defining a self-gating signal;

use the self-gating signal to determine a respiratory motion state corresponding to each of the plurality of gradient-delay-corrected radial readout views;

use the determined respiratory motion states to correct respiratory motion bias in the gradient-delay-corrected radial readout views and to yield gradient-delay-corrected and motion-compensated multi-echo data;

reconstruct one or more images using the gradient-delay-corrected and motion-compensated multi-echo data; and output the one or more images for display via a graphical user interface (GUI).

3. A method for acquiring magnetic resonance imaging data with respiratory motion compensation using one or more motion signals, the method comprising:

acquiring, using an MM scanner, a plurality of gradient-delay-corrected radial readout views, each of the plurality of gradient-delay-corrected radial readout views associated with a respective one of a plurality of azimuthal angles;

acquiring, using an image data processor, a data point from each of the plurality of gradient-delay-corrected radial readout views, the acquired data points defining a motion signal describing motion of a subject;

using the motion signal and the image data processor to determine a respiratory motion state corresponding to each of the plurality of gradient-delay-corrected radial readout views;

using the respiratory motion states and the image data processor to correct respiratory motion bias in the gradient-delay-corrected radial readout views and to yield gradient-delay-corrected and motion-compensated multi-echo data;

reconstructing, using the image data processor, one or more images using the gradient-delay-corrected and motion-compensated multi-echo data;

measuring, using the image data processor, one or more biomarker values using the one or more images; and displaying the one or more biomarker values on a display device and in a graphical user interface (GUI).

4. The method of claim 1, further comprising:

measuring, using the image data processor, one or more biomarker values using the one or more images; and displaying, using the display processor, the biomarker values on the operative interface in a graphical user interface (GUI).

5. The method of claim 4, wherein the biomarker values comprise a Proton-Density Fat Fraction (PDFF) value and an effective transverse relaxation rate ($R_2^*$) value.

6. The method of claim 4, wherein the biomarker values comprise one or more of a mapping of $T_1$ relaxation time, $T_2$ relaxation time, and tissue stiffness.

7. The method of claim 1, wherein the gradient-delay-corrected radial readout views are acquired using a golden-angle ordering scheme.

8. The method of claim 1, wherein the free-breathing multi-echo pulse sequence is a gradient-echo (GRE) stack-of-radial sequence.

9. The method of claim 1, wherein the free-breathing multi-echo pulse sequence is a stack-of-radial turbo spin echo sequence.

10. The method of claim 1, wherein the free-breathing multi-echo pulse sequence is a stack-of-spiral sequence.

11. The method of claim 1, wherein the free-breathing multi-echo pulse sequence is a 3D radial sequence.

12. The method of claim 1, wherein the free-breathing multi-echo pulse sequence is a 3D cones sequence.

13. The system of claim 2, further comprising an operator interface for presenting the one or more images in the GUI.

14. The system of claim 2, wherein the one or more processors are further configured to execute the stored instructions to reconstruct one or more biomarker maps using the one or more images; and wherein the system further comprises an operator interface for presenting the one or more biomarker maps in the GUI.

15. The method of claim 3, wherein the biomarker values comprise one or more of a Proton-Density Fat Fraction (PDFF) value and an effective transverse relaxation rate ($R_2^*$) value or a mapping of one or more of $T_1$ relaxation time, $T_2$ relaxation time, or tissue stiffness.

16. The method of claim 3, wherein the gradient-delay-corrected radial readout views are acquired using a golden-angle ordering scheme.

17. The system of claim 2, wherein the free-breathing multi-echo pulse sequence is a gradient-echo (GRE) stack-of-radial sequence, a stack-of-radial turbo spin echo sequence, a stack-of-spiral sequence, a 3D radial sequence, or a 3D cones sequence.

18. The system of claim 2, wherein the imaging device is further configured to generate the free-breathing multi-echo pulse sequence by:

acquiring calibration data from positive and negative gradient calibrations in both the x and y directions along a k-space trajectory; and cross-correlating the calibration data to calculate k-space sample shifts in kx and ky directions, respectively.

19. The system of claim 2, wherein the imaging device is further configured to generate the free-breathing multi-echo pulse sequence by:

acquiring radial readout views for all kz increments before rotating to a subsequent azimuthal angle; and correcting the k-space trajectory for the radial readout views along each azimuthal angle using the k-space sample shifts.

* * * * *